(12) United States Patent
Jeong et al.

(10) Patent No.: US 10,763,222 B2
(45) Date of Patent: Sep. 1, 2020

(54) THREE-DIMENSIONAL SEMICONDUCTOR DEVICES HAVING VERTICAL STRUCTURES OF DIFFERENT LENGTHS

(71) Applicant: Samsung Electronics Co., Ltd., Suwon-si, Gyeonggi-do (KR)

(72) Inventors: Jaeho Jeong, Suwon-si (KR); Sunyoung Kim, Seongnam-si (KR); Jang-Gn Yun, Hwaseong-si (KR); Hoosung Cho, Yongin-si (KR); Sunghoi Hur, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 127 days.

(21) Appl. No.: 15/352,890

(22) Filed: Nov. 16, 2016

(65) Prior Publication Data
US 2017/0148748 A1 May 25, 2017

(30) Foreign Application Priority Data

Nov. 25, 2015 (KR) .......................... 10-2015-0165849

(51) Int. Cl.
| | | |
|---|---|---|
| *H01L 23/00* | (2006.01) | |
| *H01L 23/522* | (2006.01) | |
| *H01L 23/528* | (2006.01) | |
| *H01L 23/544* | (2006.01) | |
| *H01L 27/11524* | (2017.01) | |
| *H01L 27/11556* | (2017.01) | |
| *H01L 27/1157* | (2017.01) | |
| *H01L 27/11582* | (2017.01) | |

(52) U.S. Cl.
CPC ........ *H01L 23/562* (2013.01); *H01L 23/5226* (2013.01); *H01L 23/5283* (2013.01); *H01L 23/544* (2013.01); *H01L 27/1157* (2013.01); *H01L 27/11524* (2013.01); *H01L 27/11556* (2013.01); *H01L 27/11582* (2013.01); *H01L 2223/5446* (2013.01)

(58) Field of Classification Search
CPC ............... H01L 23/562; H01L 23/5226; H01L 23/5283; H01L 23/544; H01L 27/11524; H01L 27/11556; H01L 27/1157; H01L 27/11582; H01L 27/78; H01L 2223/5446; H01L 22/32; H01L 22/34
USPC ........................................................ 257/314
See application file for complete search history.

(56) References Cited

U.S. PATENT DOCUMENTS

| | | |
|---|---|---|
| 7,777,341 B2 | 8/2010 | Kumagai |
| 8,076,756 B2 | 12/2011 | Lane et al. |

(Continued)

FOREIGN PATENT DOCUMENTS

KR    1020110083278    7/2011

*Primary Examiner* — Kenneth Parker
*Assistant Examiner* — Scott E Bauman
(74) *Attorney, Agent, or Firm* — Sughrue Mion, PLLC

(57) ABSTRACT

Three-dimensional (3D) semiconductor devices may be provided. A 3D semiconductor device may include a substrate including a chip region and a scribe line region, a cell array structure including memory cells three-dimensionally arranged on the chip region of the substrate, a stack structure disposed on the scribe line region of the substrate and including first layers and second layers that are vertically and alternately stacked, and a plurality of vertical structures extending along a vertical direction that is perpendicular to a top surface of the substrate and penetrating the stack structure.

20 Claims, 33 Drawing Sheets

(56) References Cited

U.S. PATENT DOCUMENTS

| | | |
|---|---|---|
| 8,125,053 B2 | 2/2012 | West et al. |
| 8,193,614 B2 | 6/2012 | Yamada et al. |
| 8,829,679 B2 | 9/2014 | Chibahara et al. |
| 8,860,208 B2 | 10/2014 | Chen et al. |
| 8,912,076 B2 | 12/2014 | West et al. |
| 8,951,842 B2 | 2/2015 | Fang et al. |
| 8,980,726 B2 | 3/2015 | Lei et al. |
| 2008/0067690 A1* | 3/2008 | Kumagai ................ H01L 21/78 257/774 |
| 2008/0099884 A1 | 5/2008 | Inohara |
| 2010/0109071 A1* | 5/2010 | Tanaka ............. H01L 27/11578 257/324 |
| 2011/0121403 A1* | 5/2011 | Lee .................. H01L 27/11526 257/390 |
| 2011/0156219 A1* | 6/2011 | Kawashima ............ H01L 22/34 257/620 |
| 2014/0252643 A1 | 9/2014 | Abe et al. |
| 2016/0005745 A1* | 1/2016 | Kim ..................... H01L 27/115 438/591 |
| 2016/0071872 A1* | 3/2016 | Saito ................ H01L 27/11582 257/314 |
| 2016/0268166 A1* | 9/2016 | Nakajima ............... H01L 21/78 |
| 2016/0365352 A1* | 12/2016 | Nishikawa ........ H01L 27/11582 |
| 2017/0062455 A1* | 3/2017 | Nomura ........... H01L 27/11582 |
| 2017/0103929 A1* | 4/2017 | Lee .................... H01L 27/1157 |

* cited by examiner

THREE-DIMENSIONAL SEMICONDUCTOR DEVICES HAVING VERTICAL STRUCTURES OF DIFFERENT LENGTHS

CROSS-REFERENCE TO RELATED APPLICATION

This application claims priority under 35 U.S.C. § 119 to Korean Patent Application No. 10-2015-0165849, filed on Nov. 25, 2015, in the Korean Intellectual Property Office, the contents of which are hereby incorporated herein by reference in their entirety.

BACKGROUND

Embodiments of the inventive concepts relate to three-dimensional (3D) semiconductor devices and, more particularly, to 3D semiconductor devices with improved structural stability.

Semiconductor devices have been highly integrated to provide excellent performance and low manufacture costs. The integration density of semiconductor devices may directly affect the costs of the semiconductor devices, which can affect demand for highly integrated semiconductor devices. An integration density of a conventional two-dimensional (2D) or planar semiconductor devices may be determined by an area where a unit memory cell occupies. Therefore, the integration density of the conventional 2D semiconductor devices may be affected by a technique of forming fine patterns. However, since high-priced apparatuses are needed to form fine patterns, the integration density of the 2D semiconductor devices continues to increase but is still limited. Thus, three-dimensional (3D) semiconductor memory devices have been developed to address the above limitations.

SUMMARY

Embodiments of the inventive concepts may provide three-dimensional (3D) semiconductor devices that are capable of preventing a cell array structure integrated on a chip region from being damaged when a substrate is sawed.

According to some embodiments of the inventive concepts, 3D semiconductor devices may be provided. A 3D semiconductor device may include a substrate including a chip region and a scribe line region, a cell array structure including memory cells three-dimensionally arranged on the chip region of the substrate, a stack structure disposed on the scribe line region of the substrate and including first layers and second layers that are vertically and alternately stacked, and a plurality of vertical structures extending along a vertical direction that is perpendicular to a top surface of the substrate and penetrating the stack structure. A sidewall of the stack structure may be perpendicular to the top surface of the substrate.

According to some embodiments of the inventive concepts, 3D semiconductor devices may be provided. A 3D semiconductor device may include a substrate including a chip region and a scribe line region, a cell array structure including a plurality of memory cells three-dimensionally arranged on the chip region of the substrate, a stack structure disposed on the scribe line region of the substrate and including first layers and second layers that are vertically and alternately stacked, and a plurality of vertical structures extending along a vertical direction that is perpendicular to a top surface of the substrate and penetrating the stack structure. The stack structure may include pad portions of which vertical distances from the top surface of the substrate, in the vertical direction, sequentially decrease as a horizontal distance from the chip region, in a direction that is parallel to the top surface of the substrate, decreases.

According to some embodiments of the inventive concepts, semiconductor devices may be provided. A semiconductor device may include a substrate that includes a top surface and a sidewall surface that is perpendicular to the top surface. The top surface of the substrate may include a cell array region, a dam region that is adjacent to a perimeter of the cell array region, and a scribe line region that is adjacent to a perimeter of the dam region. The semiconductor device may include a stack structure on the cell array region of the top surface of the substrate. The stack structure may include a plurality of insulating layers and a plurality of electrode layers that are disposed between adjacent ones of the insulating layers. The semiconductor device may include a dam pattern on the dam region of the top surface of the substrate. The dam pattern may extend in a vertical direction that is substantially perpendicular to the top surface of the substrate. The semiconductor device may include a dummy stack structure on the scribe line region of the top surface of the substrate. The dummy stack structure may include a plurality of dummy insulating layers that are aligned with ones of the plurality of insulating layers of the stack structure and a plurality of sacrificial layers that are disposed between adjacent ones of the dummy insulating layers and aligned with the electrode layers of the stack structure. The dummy stack structure may include a sidewall surface that is aligned with the sidewall surface of the substrate. The semiconductor device may include a plurality of dummy vertical structures on the scribe line region of the top surface of the substrate. The plurality of dummy vertical structures may extend in the vertical direction that is substantially perpendicular to the top surface of the substrate and may be spaced apart from each other in a first direction that is parallel to the top surface of the substrate and perpendicular to the sidewall surface of the substrate.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
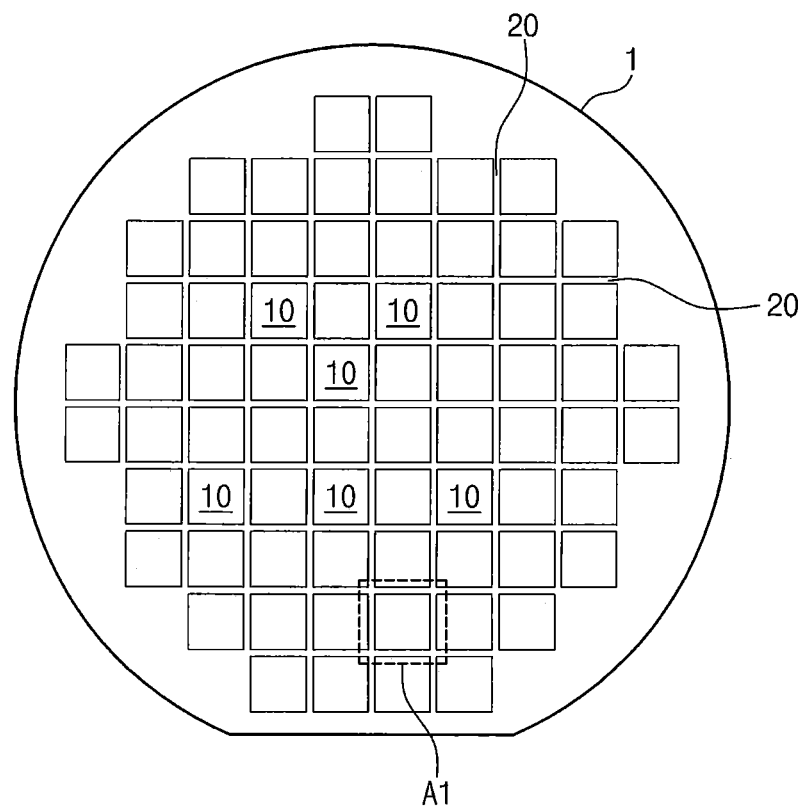
FIG. 1 is a plan view illustrating a substrate on which three-dimensional (3D) semiconductor devices according to some embodiments of the inventive concepts are integrated.

The inventive concepts will now be described more fully hereinafter with reference to the accompanying drawings, in which exemplary embodiments of the inventive concepts are shown. The inventive concepts and methods of achieving them will be apparent from the following exemplary embodiments that will be described in more detail with reference to the accompanying drawings. The embodiments of the inventive concepts may, however, be embodied in different forms and should not be constructed as limited to the embodiments set forth herein. Rather, these embodiments are provided so that this disclosure will be thorough and complete, and will fully convey the scope of the inventive concepts to those skilled in the art.

As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present. As used herein, the term "and/or" includes any and all combinations of one or more of the associated listed items. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Similarly, it will be understood that when an element such as a layer, region or substrate is referred to as being "connected to" or "on" another element, it can be directly connected to or on the other element or intervening elements may be present. In contrast, the term "directly" means that there are no intervening elements. Additionally, embodiments that are described in the detailed description may be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes.

Embodiments of the present inventive concepts explained and illustrated herein may include their complementary counterparts. The same reference numerals or the same reference designators denote the same elements throughout the specification.

Figure 2:
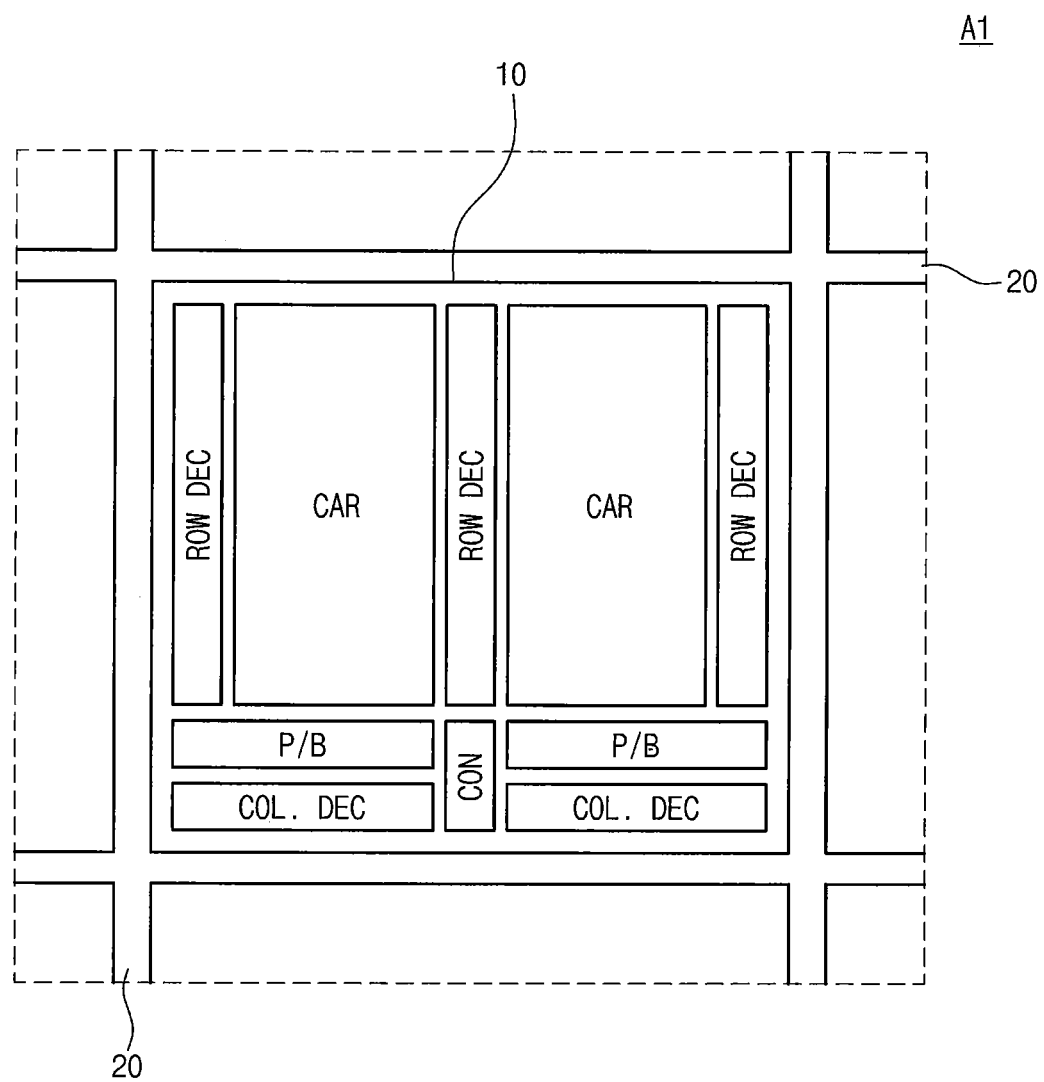
FIG. 2 is an enlarged view of a portion 'A1' of FIG. 1.

FIG. 1 is a plan view illustrating a substrate 1 on which three-dimensional (3D) semiconductor devices according to some embodiments of the inventive concepts are integrated. FIG. 2 is an enlarged view of a portion 'A1' of FIG. 1.

Referring to FIGS. 1 and 2, a substrate 1 (e.g., a wafer) may include chip regions 10 and a scribe line region 20 between the chip regions 10. Semiconductor chips may be formed on the chip regions 10, respectively. The chip regions 10 may be two-dimensionally arranged on the substrate 1, and the chip regions 10 may be surrounded by the scribe line region 20 when viewed from a plan view. In other words, the scribe line region 20 may be disposed between the chip regions 10. As used herein, it will be understood that elements that are referred to as being two-dimensionally arranged may be arranged in two dimensions along a plane. For example, elements that are two-dimensionally arranged may include an array of elements that are formed into rows and columns. As used herein, it will be understood that elements that are referred to as being three-dimensionally arranged may be arranged in three dimensions. For example, elements that are three-dimensionally arranged may include a plurality of layers, wherein ones of the layers include respective arrays of elements that are formed into rows and columns. As used herein, it will be understood that elements that are referred to as being one-dimensionally arranged may be arranged in substantially only one dimension, for example along a line.

The substrate 1 may be a bulk silicon substrate, a silicon-on-insulator (SOI) substrate, a germanium substrate, a germanium-on-insulator (GOI) substrate, a silicon-germanium substrate, or a substrate having an epitaxial thin layer obtained by performing a selective epitaxial growth (SEG) process. The substrate 1 may be formed of a semiconductor material. For example, the substrate 1 may include at least one of silicon (Si), germanium (Ge), silicon-germanium (SiGe), gallium-arsenic (GaAs), indium-gallium-arsenic (InGaAs), or aluminum-gallium-arsenic (AlGaAs).

In some embodiments, a 3D semiconductor device may be formed on the chip regions 10 of the substrate 1. For example, the 3D semiconductor device may include a semiconductor memory device such as a dynamic random access memory (DRAM) device, a static random access memory (SRAM) device, a flash memory device, or a resistive random access memory (RRAM) device. Alternatively, the 3D semiconductor device may include at least one of a micro electro mechanical system (MEMS) device, an optoelectronic device, or a processor (e.g., a central processing unit (CPU) or a digital signal processor).

Referring to FIG. 2, cell arrays CAR and peripheral logic circuits may be disposed on the chip regions 10 of the substrate 1. The peripheral logic circuits may include row decoders ROW DEC, column decoders COL DEC, page buffers P/B, and/or control circuits CON.

Ones of the cell arrays CAR may include a plurality of memory cells three-dimensionally arranged, bit lines, and word lines. The bit lines and the word lines may be electrically connected to the memory cells. The peripheral logic circuits may be electrically connected to the cell arrays CAR to control operations of the cell arrays CAR. The row decoder ROW DEC may decode an address signal inputted from an external system to select one among the word lines. The column decoder COL DEC may decode an address signal inputted from the external system to select one among the bit lines. The page buffer P/B may be connected to the cell array CAR through the bit lines to read data stored in the memory cells. The page buffer P/B may be connected to the selected bit line based on the address signal decoded from the column decoder COL DEC. The control circuits CON may control read, write and/or erase operations of the memory cells in response to control signals.

These semiconductor integrated circuits (i.e., the 3D semiconductor devices) may be manufactured by performing semiconductor manufacturing processes on the chip regions 10 of the substrate 1. The semiconductor integrated circuits may be protected by an insulating material, and a sawing process may be performed along the scribe line region 20 after formation of the semiconductor integrated circuits. Thus, the chip regions 10 of the substrate 1, on which the semiconductor integrated circuits are formed, may be separated from each other.

Figure 3A:
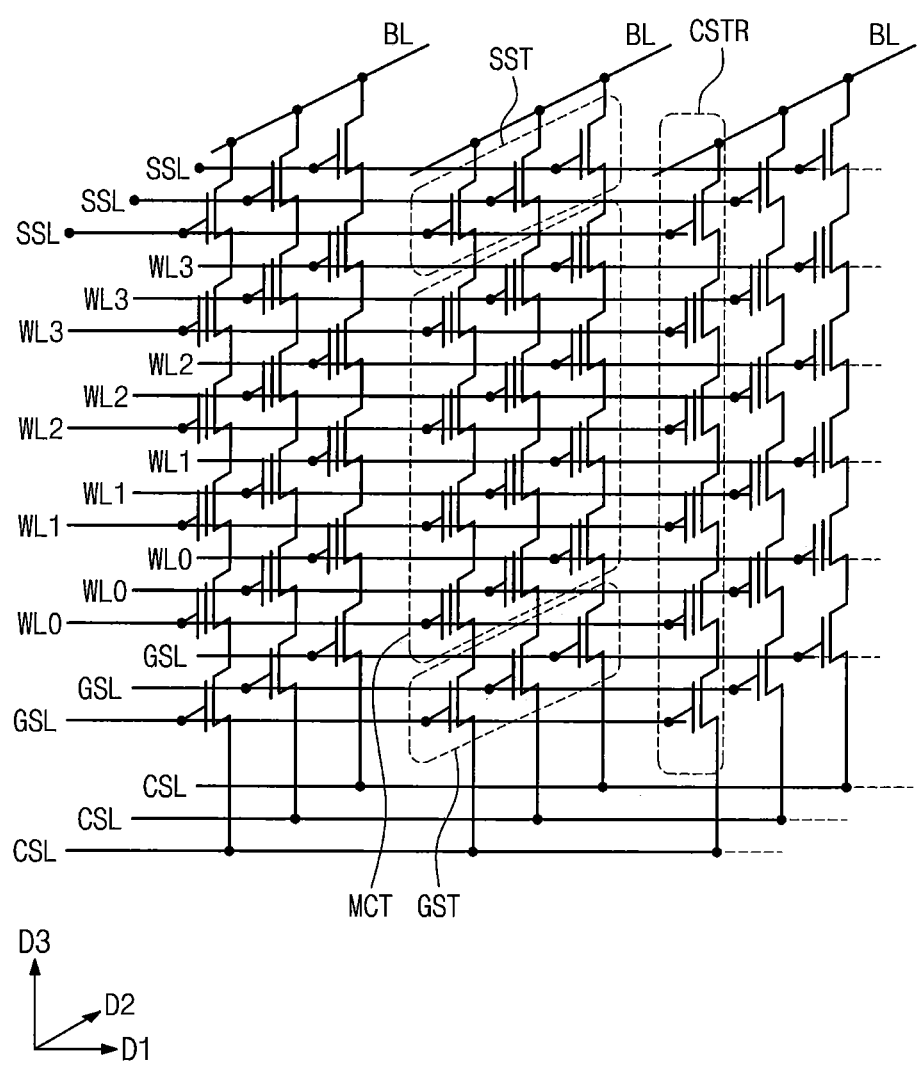
FIGS. 3A, 3B, and 3C are schematic circuit diagrams illustrating cell arrays of 3D semiconductor devices according to some embodiments of the inventive concepts.
Figure 3B:
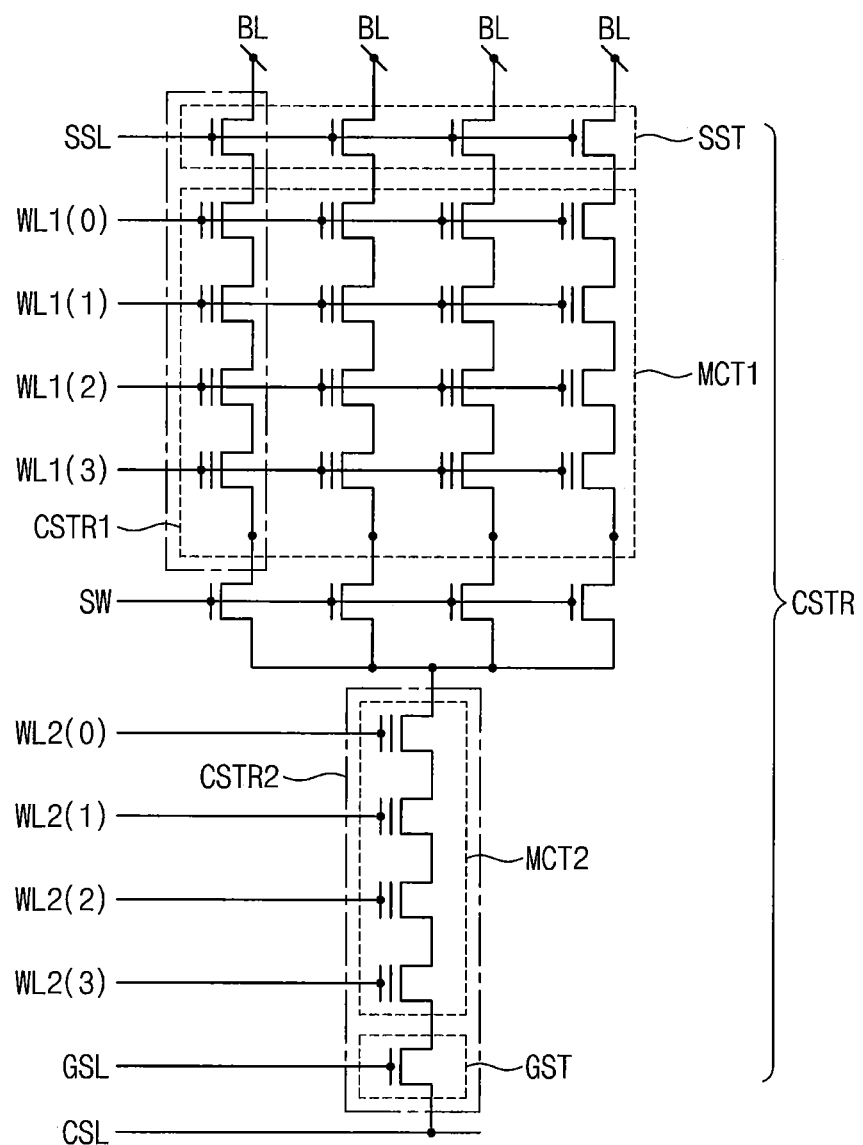
Figure 3C:
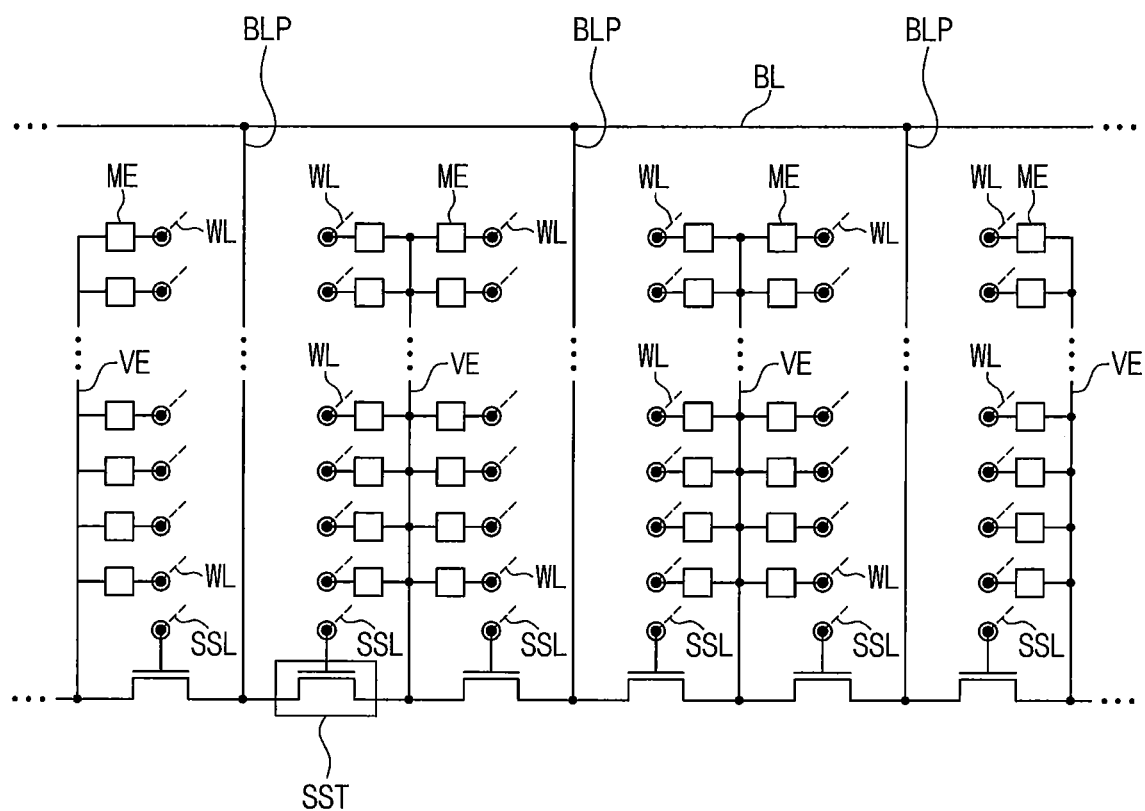

FIGS. 3A, 3B, and 3C are schematic circuit diagrams illustrating cell arrays of 3D semiconductor devices according to some embodiments of the inventive concepts.

Referring to FIG. 3A, a 3D semiconductor device may include a common source line CSL, a plurality of bit lines BL, and a plurality of cell strings CSTR disposed between the common source line CSL and the bit lines BL.

The common source line CSL may be a conductive layer disposed on the substrate 1 or a dopant region formed in the substrate 1. The bit lines BL may be conductive patterns (e.g., metal lines) that are disposed over the substrate 1 and are vertically spaced apart from the substrate 1. The bit lines BL may be two-dimensionally arranged when viewed from a plan view, and a plurality of the cell strings CSTR may be connected in parallel to ones of the bit lines BL. Thus, the cell strings CSTR may be two-dimensionally arranged on the common source line CSL or the substrate 1.

Ones of the cell strings CSTR may include a ground selection transistor GST connected to the common source line CSL, a string selection transistor SST connected to the bit line BL, and a plurality of memory cell transistors MCT interposed between the ground and string selection transistors GST and SST. The ground selection transistor GST, the memory cell transistors MCT, and the string selection transistor SST may be connected in series to each other in the order named. A ground selection line GSL, a plurality of word lines WL0 to WL3, and a string selection line SSL, which are disposed between the common source line CSL and the bit lines BL, may be used as a gate electrode of the ground selection transistor GST, gate electrodes of the memory cell transistors MCT, and a gate electrode of the string selection transistor SST, respectively.

Gate electrodes of the ground selection transistors GST may be connected in common to the ground selection line GSL so as to be in an equipotential state. Similarly, gate electrodes of a plurality of memory cell transistors MCT disposed at the same level with respect to the common source line CSL may be connected in common to one of the word lines WL0 to WL3 so as to be in an equipotential state. Since one cell string CSTR includes the plurality of memory cell transistors MCT respectively located at different levels from the common source line CSL, the word lines WL0 to WL3 respectively located at different levels from each other may be disposed between the common source line CSL and the bit lines BL.

Ones of the cell strings CSTR may include an active pattern that vertically extends from the common source line CSL so as to be connected to the bit line BL. A data storage layer may be disposed between the active pattern and the word lines WL0 to WL3. In some embodiments, the data storage layer may include a material capable of storing charges or a layer structure capable of storing charges. For example, the data storage layer may include a trap site-rich insulating layer (e.g., a silicon nitride layer), a floating gate electrode, or an insulating layer including conductive nano dots.

Referring to FIG. 3B, a 3D semiconductor device may include a common source line CSL, a plurality of bit lines BL, and a cell string CSTR disposed between the common source line CSL and the bit lines BL.

The cell string CSTR may include a plurality of upper strings CSTR1 respectively connected to the bit lines BL, and one lower string CSTR2 connected to the common source line CSL. The plurality of upper strings CSTR1 may be connected in common to the one lower string CSTR2. The upper strings CSTR1 may be connected to the lower string CSTR2 through switching elements SW, respectively. The switching elements SW connected to the upper strings CSTR1 may be electrically controlled by the same voltage.

Ones of the upper strings CSTR1 may include a string selection transistor SST connected to respective ones of the bit lines BL and a plurality of upper memory cell transistors MCT1 disposed between the string selection transistor SST and the switching element SW. The string selection transistor SST and the upper memory cell transistors MCT1 may be connected in series to each other. The lower string CSTR2 may include a ground selection transistor GST connected to the common source line CSL and a plurality of lower memory cell transistors MCT2 disposed between the ground selection transistor GST and the switching elements SW. The ground selection transistor GST and the lower memory cell transistors MCT2 may be connected in series to each other.

A string selection line SSL and upper word lines WL1(0) to WL1(3), which are disposed between the bit lines BL and the switching elements SW, may be used as gate electrodes of the string selection transistor SST and the upper memory cell transistors MCT1, respectively. A ground selection line GSL and lower word lines WL2(0) to WL2(3), which are disposed between the common source line CSL and the switching elements SW, may be used as gate electrodes of the ground selection transistor GST and the lower memory cell transistors MCT2, respectively. Ones of the upper and lower memory cell transistors MCT1 and MCT2 may include a data storage element.

The plurality of upper strings CSTR1 respectively connected to the bit lines BL may be connected in common to the one lower string CSTR2 connected to the common source line CSL. Thus, the upper strings CSTR1 including the string selection transistors SST respectively connected to the bit lines BL may share the ground selection transistor GST included in the one lower string CSTR2. In other words, the upper strings CSTR1 which are connected to different bit lines so as to be operated independently of each other may be connected in common to the one lower string CSTR2 to share the ground selection transistor GST, and thus a highly integrated semiconductor device may be realized.

Referring to FIG. 3C, a plurality of string selection transistors SST may be connected in parallel to a bit line BL through a plurality of bit line plugs BLP. The bit line plugs BLP may be connected in common to a pair of the string selection transistors SST adjacent thereto.

A plurality of word lines WL and a plurality of vertical electrodes VE may be disposed between the bit line BL and the string selection transistors SST. The vertical electrodes VE may be disposed between the bit line plugs BLP adjacent to each other. For example, the vertical electrodes VE and the bit line plugs BLP may be alternately arranged along a direction that is parallel to the bit line BL. In addition, the vertical electrodes VE may be connected in common to a pair of the string selection transistors SST adjacent thereto.

A plurality of memory elements ME may be connected in parallel to the vertical electrodes VE. The memory elements ME may be connected to corresponding ones of the word lines WL. In other words, the word lines WL may be connected to corresponding ones of the vertical electrodes VE through the corresponding ones of the memory elements ME.

A string selection line SSL may be connected to a gate electrode of ones of the string selection transistors SST. In some embodiments, the string selection lines SSL may be parallel to the word lines WL.

The cell arrays of the 3D semiconductor devices of FIGS. 3A to 3C are described as examples of the inventive concepts. However, embodiments of the inventive concepts are not limited thereto.

Figure 4:
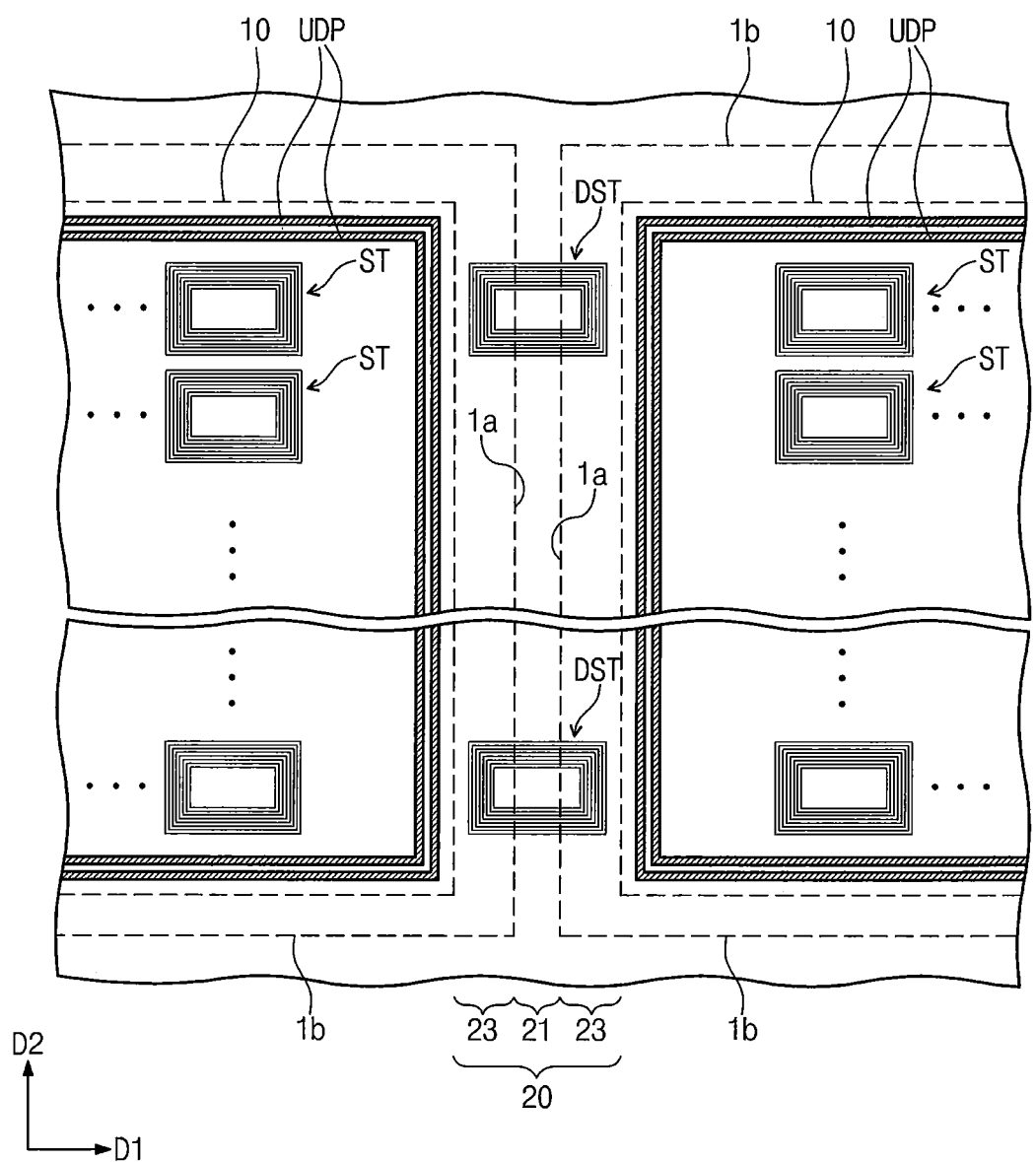
FIG. 4 is a plan view illustrating a portion of a substrate on which 3D semiconductor devices according to some embodiments of the inventive concepts are integrated.

FIG. 4 is a plan view illustrating a portion of a substrate on which 3D semiconductor devices according to some embodiments of the inventive concepts are integrated. FIGS. 5A to 5G are cross-sectional views illustrating a method of manufacturing a 3D semiconductor device according to some embodiments of the inventive concepts.

Figure 5A:
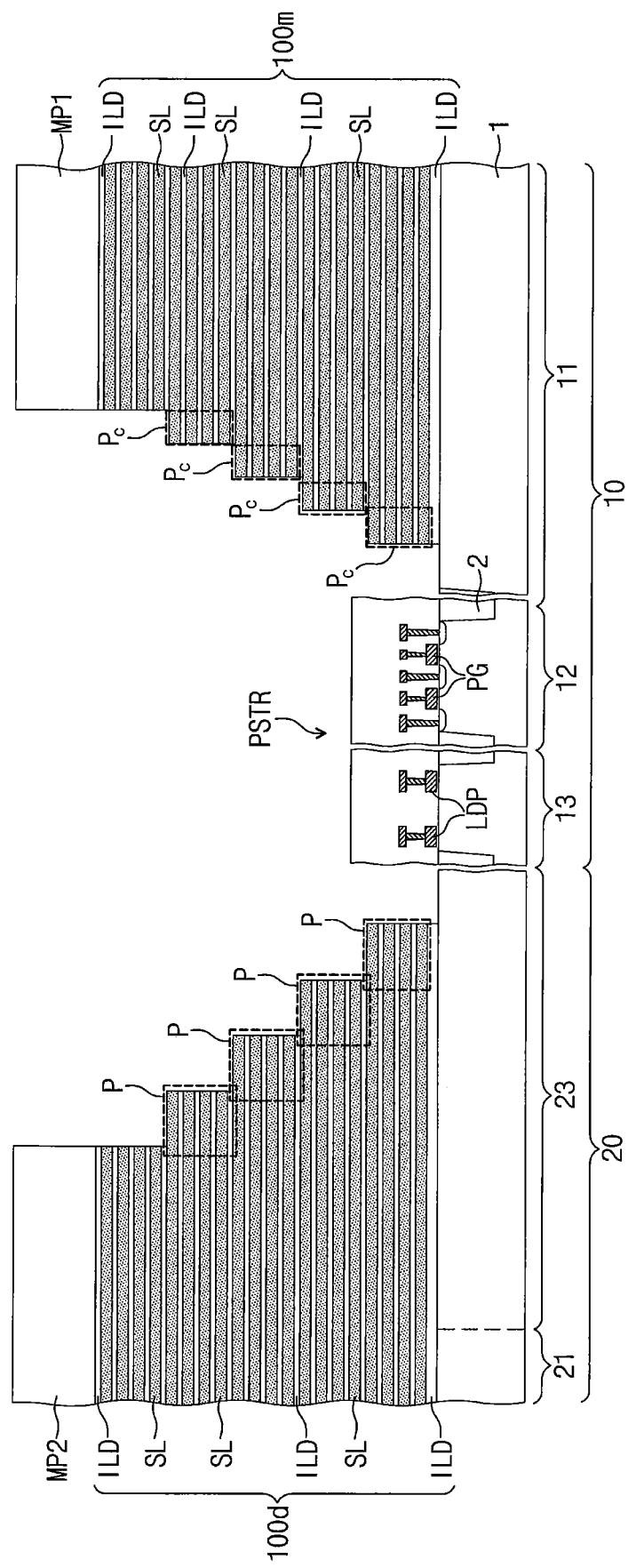
FIGS. 5A to 5G are cross-sectional views illustrating a method of manufacturing a 3D semiconductor device according to some embodiments of the inventive concepts.

Referring to FIGS. 4 and 5A, a substrate 1 may be prepared. The substrate 1 may include chip regions 10 and a scribe line region 20 between the chip regions 10. The substrate 1 may include a material having a semiconductor characteristic (e.g., a silicon wafer), an insulating material (e.g., a glass substrate), or a semiconductor or conductor covered with an insulating material. For example, the substrate 1 may be a silicon wafer having a first conductivity type.

The chip region 10 of the substrate 1 may include a cell array region 11, a peripheral circuit region 12, and a dam region 13. The peripheral circuit region 12 may be disposed around the cell array region 11, and the dam region 13 may be disposed along an edge of the chip region 10 to surround the cell array region 11 and the peripheral circuit region 12. A scribe line region 20 may include a cutting region 21 and an edge region 23 disposed between the cutting region 21 and the chip region 10. The cutting region 21 may be disposed in a central portion of the scribe line region 20 and may be sawed by a sawing machine.

In some embodiments, a mold structure 100m may be formed on the cell array region 11 of the substrate 1, and a dummy mold structure 100d may be formed on the scribe line region 20 of the substrate 1. In addition, a peripheral logic structure PSTR may be formed on the peripheral circuit region 12 of the substrate 1, and at least one lower dam pattern LDP may be formed on the dam region 13 of the substrate 1.

In some embodiments, the dummy mold structure 100d may be formed simultaneously with the mold structure 100m. In some embodiments, the peripheral logic structure PSTR and the lower dam pattern LDP may be formed before the formation of the mold structure 100m and the dummy mold structure 100d.

In more detail, the peripheral logic structure PSTR may include the row and column decoders ROW DEC and COL DEC, the page buffer P/B, and the control circuits CON, which are described with reference to FIG. 2. In other words, the peripheral logic structure PSTR may include NMOS transistors, PMOS transistors, resistors, and/or capacitors which may be electrically connected to a cell array structure.

In some embodiments, a device isolation layer 2 may be formed in the peripheral circuit region 12 of the substrate 1 to define an active region. The peripheral logic structure PSTR may include a peripheral gate electrode PG intersecting the active region, source and drain dopant regions formed in the active region at both sides of the peripheral gate electrode PG, and a peripheral insulating pattern covering peripheral circuits. A top surface of the peripheral insulating pattern may be lower than a top surface of the mold structure 100m.

The lower dam patterns LDP may be disposed on the dam region 13 of the substrate 1 and may extend along the edge of the chip region to have a ring shape or a closed-loop shape. The lower dam patterns LDP may include contact plugs penetrating an insulating layer and conductive patterns disposed on the contact plugs.

Forming the mold structure 100m and the dummy mold structure 100d may include forming a thin layer structure on substantially all of a top surface of the substrate 1 and performing a trimming process on the thin layer structure.

In some embodiments, the thin layer structure may be formed on the scribe line region 20 of the substrate 1 and the chip regions 10. In other words, the thin layer structure may cover substantially all of the top surface of the substrate 1. Sacrificial layers SL and insulating layers ILD may be alternately and repeatedly stacked on the substrate 1 to form the thin layer structure. The sacrificial layers SL may be formed of a material having an etch selectivity with respect to the insulating layers ILD. For example, a difference between an etch rate of the sacrificial layers SL and an etch rate of the insulating layers ILD may be large in a wet etching process using a chemical solution but may be small in a dry etching process using an etching gas. In some embodiments, the sacrificial layers SL and the insulating layers ILD may be formed of insulating materials and may have etch rates different from each other. In other words, the sacrificial layers SL may be formed of a different insulating material from the insulating layers ILD. For example, each of the sacrificial layers SL may include at least one of a silicon layer, a silicon oxide layer, a silicon carbide layer, a silicon-germanium layer, a silicon oxynitride layer, or a silicon nitride layer. The insulating layers ILD may include at least one of a silicon layer, a silicon oxide layer, a silicon carbide layer, a silicon-germanium layer, a silicon oxynitride layer, or a silicon nitride layer. At this time, the insulating layers ILD may include a different material from the sacrificial layers SL. In some embodiments, the sacrificial layers SL may be formed of a silicon nitride layer, and the insulating layers ILD may be formed of a low-k dielectric layer. Alternatively, the sacrificial layers SL may be formed of a conductive material, and the insulating layers ILD may be formed of an insulating material.

The sacrificial layers SL and the insulating layers ILD may be formed using a thermal chemical vapor deposition (CVD) process, a plasma-enhanced CVD process, a physical CVD process, or an atomic layer deposition (ALD) process.

In some embodiments, thicknesses of the sacrificial layers SL may be equal to each other. Alternatively, the lowermost one and the uppermost one of the sacrificial layers SL may be thicker than other sacrificial layers SL interposed therebetween. Likewise, the insulating layers ILD may have the same thickness, or a thickness of one or more of the insulating layers ILD may be different from that of another or others of the insulating layers ILD. In some embodiments, the lowermost one of the insulating layers ILD of the thin layer structure may be thinner than the sacrificial layers SL and the insulating layers ILD disposed thereon.

In some embodiments, after the formation of the thin layer structure, the trimming process of patterning the thin layer structure may be performed to form stepwise structures on an edge region of the cell array region 11 and the edge region 23 of the scribe line region 20, respectively. In some embodiments, the trimming process may include a process of forming a mask pattern on the thin layer structure, a process of etching the thin layer structure, and a process of reducing a planar area of the mask pattern. Here, the process of etching the thin layer structure and the process of reducing the planar area of the mask pattern may be alternately repeated during the trimming process. The mask pattern may include a first mask pattern MP1 on the cell array region 11 and a second mask pattern MP2 on the scribe line region 20.

Meanwhile, in some embodiments, the trimming process may be performed on the thin layer structure of the cell array region 11. In this case, the formation of the second mask pattern MP2 on the scribe line region 20 may be omitted.

In some embodiments, portions of the thin layer structure on the dam region 13 of the substrate 1 and the peripheral circuit region 12 may be removed by the trimming process performed on the thin layer structure. Thus, the substrate 1 and/or the peripheral logic structure PSTR may be exposed between the mold structure 100m and the dummy mold structure 100d.

The process of reducing the planar areas of the mask patterns MP1 and MP2 may be a process of enlarging regions exposed by the mask patterns MP1 and MP2. Widths and thicknesses of the mask patterns MP1 and MP2 may be reduced as the process of etching the thin layer structure is repeatedly performed. In addition, the mask patterns MP1 and MP2 may remain on the mold structure 100m and the dummy mold structure 100d until the uppermost sacrificial layer SL is patterned to form the stepwise structures. A process of removing the remaining mask patterns MP1 and MP2 may be performed after the formation of the mold structure 100m and the dummy mold structure 100d which have the stepwise structures.

In some embodiments, each of the processes of etching the thin layer structure may etch a plurality of sacrificial layers SL and a plurality of insulating layers ILD. In this case, the sacrificial layers SL etched by the same etching process may have the same planar area, and the sacrificial layers SL etched by different etching processes may have areas different from each other. In some embodiments, end portions of the sacrificial layers SL may be sequentially exposed on each of the cell array region 11 and the scribe line region 20 by the trimming process.

After the trimming process is performed, the mold structure 100m and the dummy mold structure 100d may have sidewall profiles corresponding to the stepwise structures. For example, the mold structure 100m may have a downward stepwise structure toward the peripheral circuit region 12, and the dummy mold structure 100d may have a downward stepwise structure toward the chip region 10. In some embodiments, the mold structure 100m may include pad portions Pc of which levels from the substrate 1 sequentially decrease as a distance from the scribe line region 20 decreases. The dummy mold structure 100d may include pad portions P of which levels from the substrate 1 sequentially decrease as a distance from the chip region 10 decreases. In other words, the pad portions P of the dummy mold structure 100d may face the pad portions Pc of the mold structure 100m. As used herein, it will be understood that levels may refer to distances from the top surface of the substrate 1 in a vertical direction that is perpendicular to the top surface of the substrate 1.

In some embodiments, ones of the pad portions Pc of the mold structure 100m may each include at least two sacrificial layers SL continuously stacked and the insulating layers ILD disposed between the at least two sacrificial layers SL. In addition, ones of the pad portions Pc of the dummy mold structure 100d may each include at least two sacrificial layers SL continuously stacked and the insulating layers ILD disposed therebetween. The areas of the sacrificial layers SL included in the pad portions P may be substantially equal to each other, and horizontal distances between sidewalls of the pad portions P may be substantially equal to each other. As used herein, it will be understood that when distances, directions and/or elements are referred to as being horizontal, they are substantially parallel to the top surface of the substrate 1. Accordingly, when distances, directions and/or elements are referred to as being vertical, they are substantially perpendicular to the top surface of the substrate 1.

In the mold structure 100m, horizontal distances from the peripheral circuit region 12 to the sidewalls of the pad portions Pc may sequentially increase as a height from the substrate 1 increases. In the dummy mold structure 100d, horizontal distances from the chip region 10 to sidewalls of the pad portions P may sequentially increase as a height from the substrate 1 increases.

In addition, in some embodiments, horizontal distances between the sidewalls of the pad portions Pc of the mold structure 100m may be different from horizontal distances between the sidewalls of the pad portions P of the dummy mold structure 100d. Alternatively, in some embodiments, the horizontal distances between the sidewalls of the pad portions Pc of the mold structure 100m may be substantially equal to the horizontal distances between the sidewalls of the pad portions P of the dummy mold structure 100d.

Figure 18:
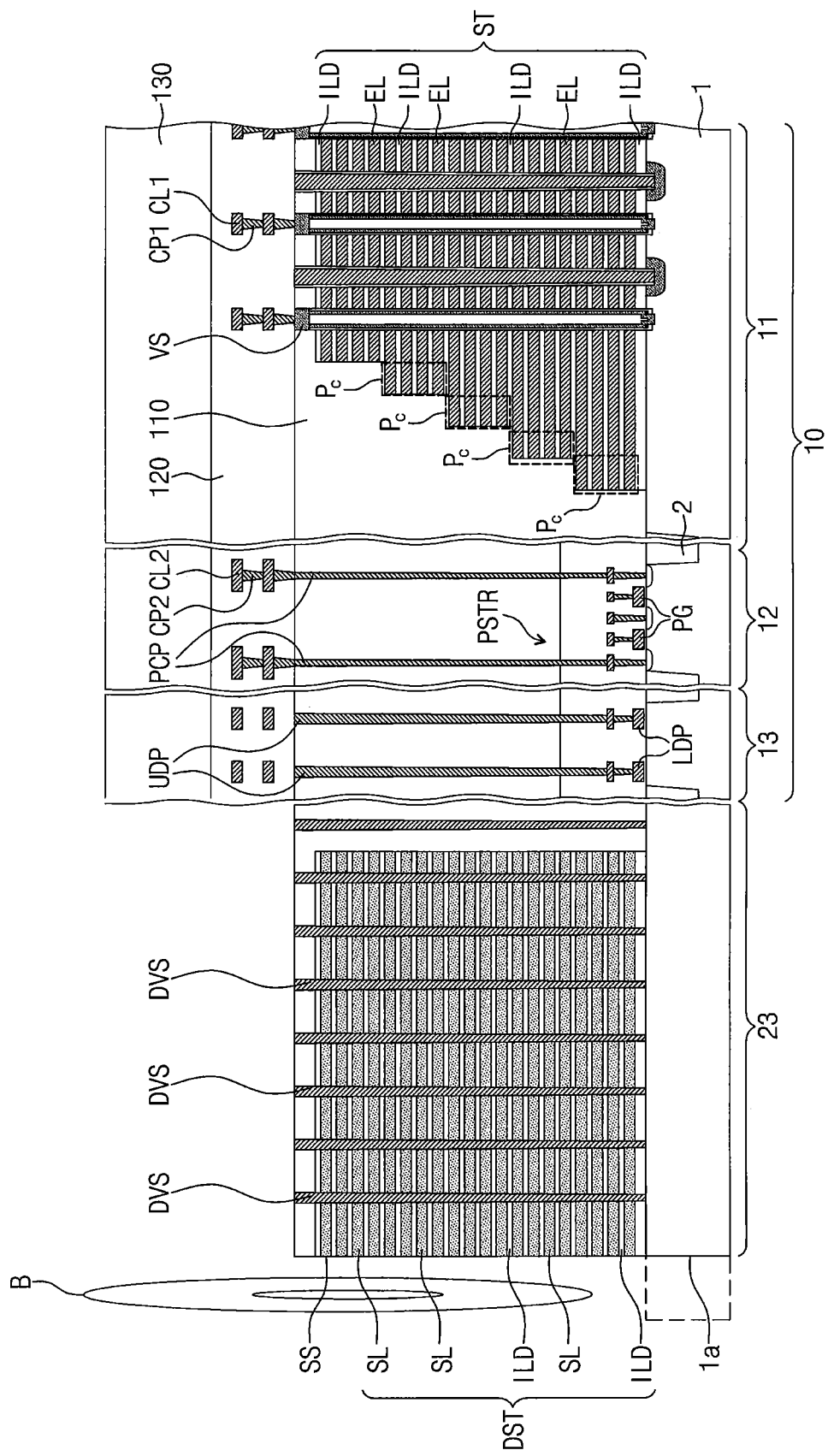

In some embodiments, the mold structure 100m may include the pad portions Pc having the stepwise structure on the edge region of the cell array region 11, but a sidewall of the dummy mold structure 100d adjacent to the chip region 10 may be substantially vertical to the top surface of the substrate 1, as illustrated in FIG. 18.

Figure 5B:
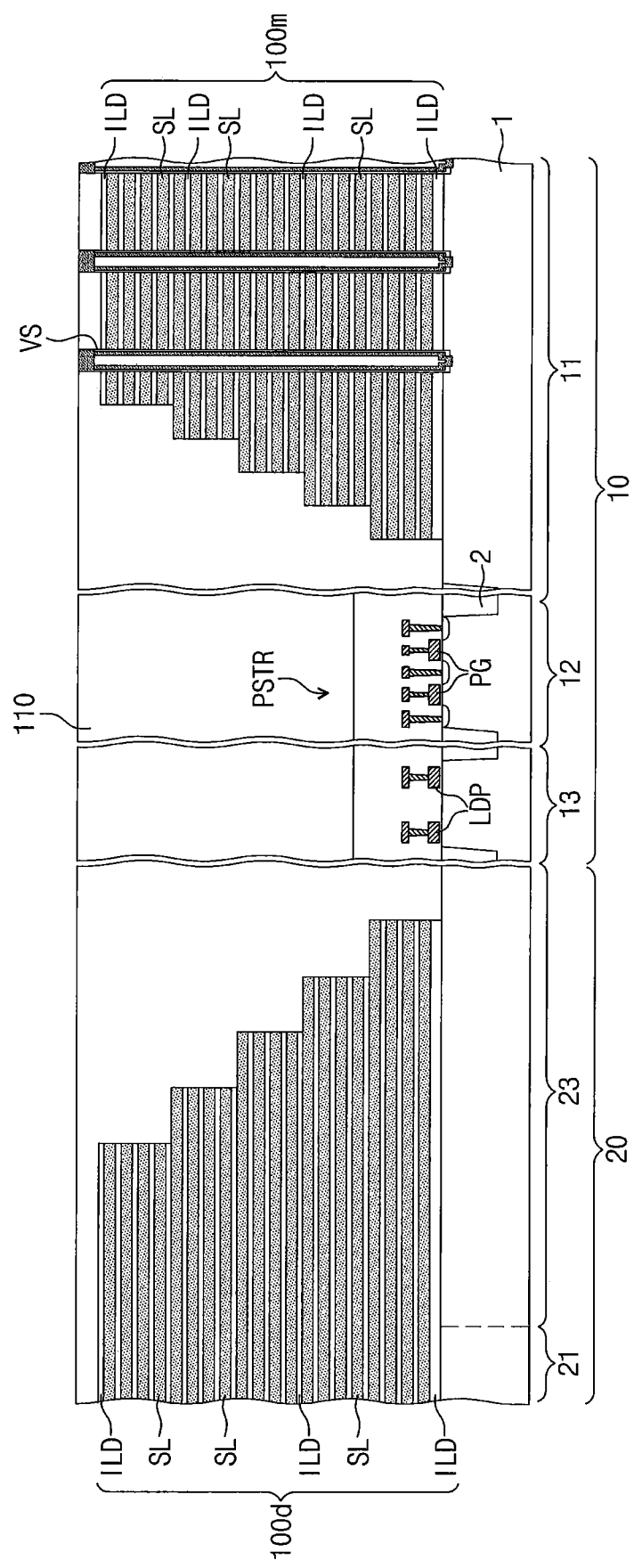

Referring to FIGS. 4 and 5B, a filling insulation layer 110 may be formed on an entire top surface of the substrate 1, and then, a plurality of vertical structures VS may be formed to penetrate the mold structure 100m of the cell array region 11. The vertical structure VS of the cell array region 11 may be defined as a cell vertical structure VS. The vertical structures VS may include a semiconductor material or a conductive material.

In some embodiments, forming the vertical structures VS may include forming openings penetrating the mold structure 100m and forming semiconductor patterns in the openings, respectively. Forming the openings may include forming a mask pattern defining the openings on the mold structure 100m and anisotropically etching the mold structure 100m using the mask pattern as an etch mask. The top surface of the substrate 1 may be etched by over-etching of the anisotropic etching process, and thus the substrate 1 exposed through the openings may be recessed by a predetermined depth. The openings constituting each column may be arranged in a line or in a zigzag form along one direction when viewed from a plan view.

In some embodiments, forming the semiconductor patterns in the openings may include forming semiconductor spacers covering sidewalls of the openings, respectively, and forming semiconductor body portions connected to the substrate 1 in the openings, respectively. The semiconductor pattern may have a hollow pipe or macaroni shape. At this time, a bottom end of the semiconductor pattern may be in a closed state. For example, the semiconductor pattern may include silicon (Si), germanium (Ge), or a combination thereof. The semiconductor pattern may include a semiconductor material doped with dopants or an intrinsic semiconductor material not doped with dopants. The semiconductor pattern may have a crystal structure including at least one of a single-crystalline structure, an amorphous structure, or a poly-crystalline structure. In addition, the vertical structure VS may further include a conductive pad disposed on a top end of the semiconductor pattern. The conductive pad may be a dopant region doped with dopants or may include a conductive material. In some embodiments, a vertical insulating pattern VP of FIG. 6A may be formed in each of the openings before the formation of the semiconductor patterns in the openings. In some embodiments, the vertical insulating pattern VP may be at least a portion of a data storage layer and will be described in more detail with reference to FIGS. 6A to 6C.

Figure 5C:
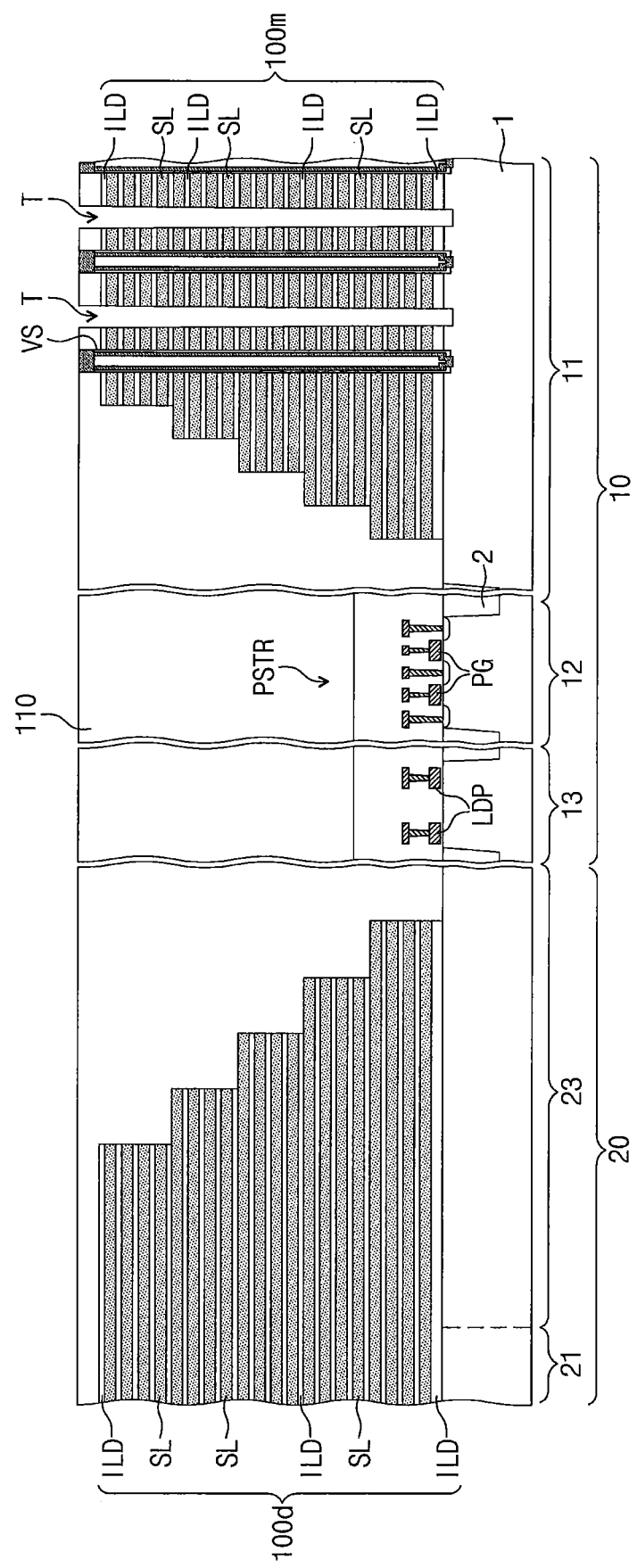

Referring to FIGS. 4 and 5C, trenches T may be formed to penetrate the mold structure 100m of the cell array region 11.

Forming the trenches T may include forming a mask patterns defining the trenches T on the mold structure 100m, and anisotropically etching the mold structure 100m using the mask pattern as an etch mask.

The trenches T may be laterally spaced apart from the vertical structures VS to expose sidewalls of the sacrificial layers SL and sidewalls of the insulating layers ILD. Each of the trenches T may have a linear or rectangular shape in a plan view and may expose the top surface of the substrate 1. The top surface of the substrate 1 exposed through the trenches T may be recessed by a predetermined depth by over-etching during the formation of the trenches T. In some embodiments, the trenches T may have inclined sidewalls.

When the trenches T are formed, the mold structure 100m may be divided into a plurality of line-shaped mold structures 100m extending in one direction. A plurality of the vertical structures VS may penetrate each of the line-shaped mold structures 100m. However, in some embodiments, the process of forming the trenches T may be omitted.

Figure 5D:
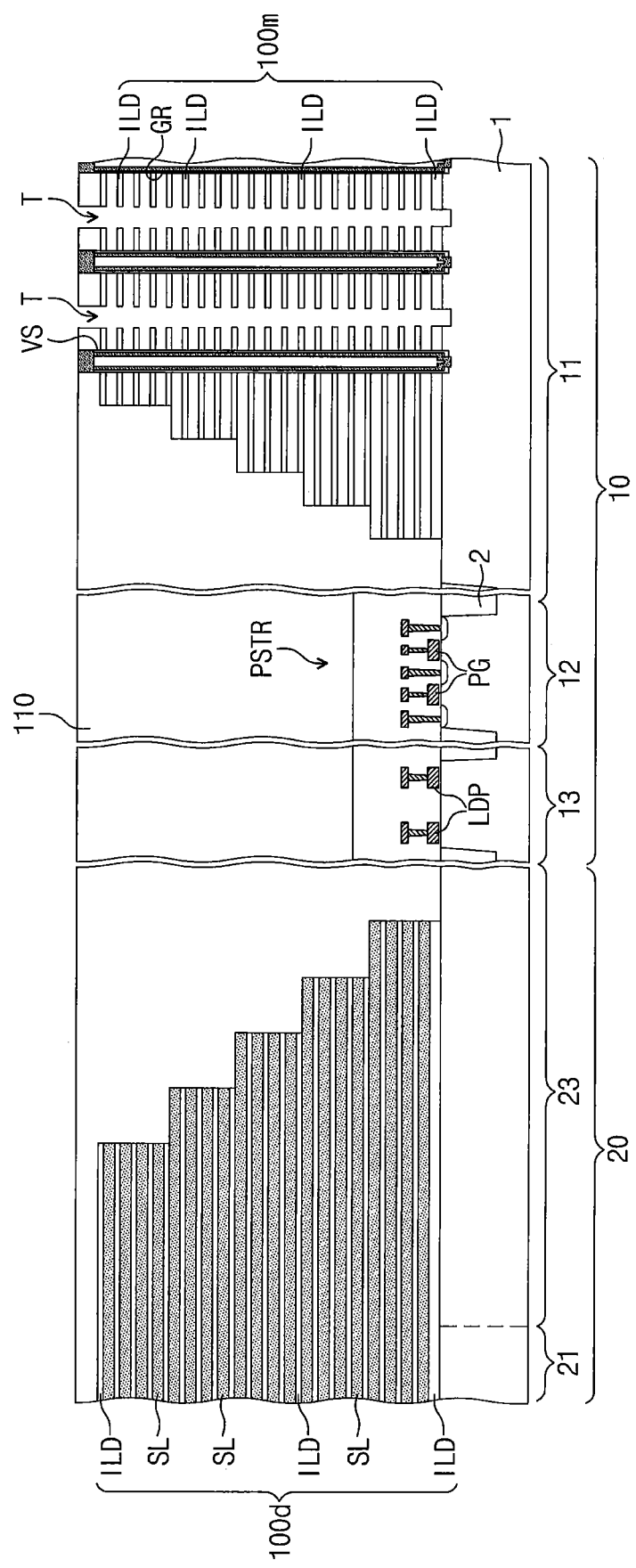

Referring to FIGS. 4 and 5D, the sacrificial layers SL exposed by the trenches T may be removed to form gate regions GR between the insulating layers ILD.

The gate regions GR may be formed by isotropically etching the sacrificial layers SL using an etch recipe having an etch selectivity with respect to the insulating layers ILD, the vertical structures VS, and the substrate 1. The sacrificial layers SL may be completely removed by the isotropic etching process. For example, when the sacrificial layers SL are silicon nitride layers and the insulating layers ILD are silicon oxide layers, the isotropic etching process may be performed using an etching solution including phosphoric acid. The gate regions GR formed as described above may laterally extend from the trench T into between the insulating layers ILD and may expose portions of the sidewall of the vertical structure VS, respectively. In other words, each of the gate regions GR may be defined by the insulating layers ILD vertically adjacent to each other and the portion of the sidewall of the vertical structure VS. In some embodiments, when the vertical insulating pattern VP is formed in each of the openings, the gate regions GR may expose portions of a sidewall of the vertical insulating pattern VP, respectively.

Figure 5E:
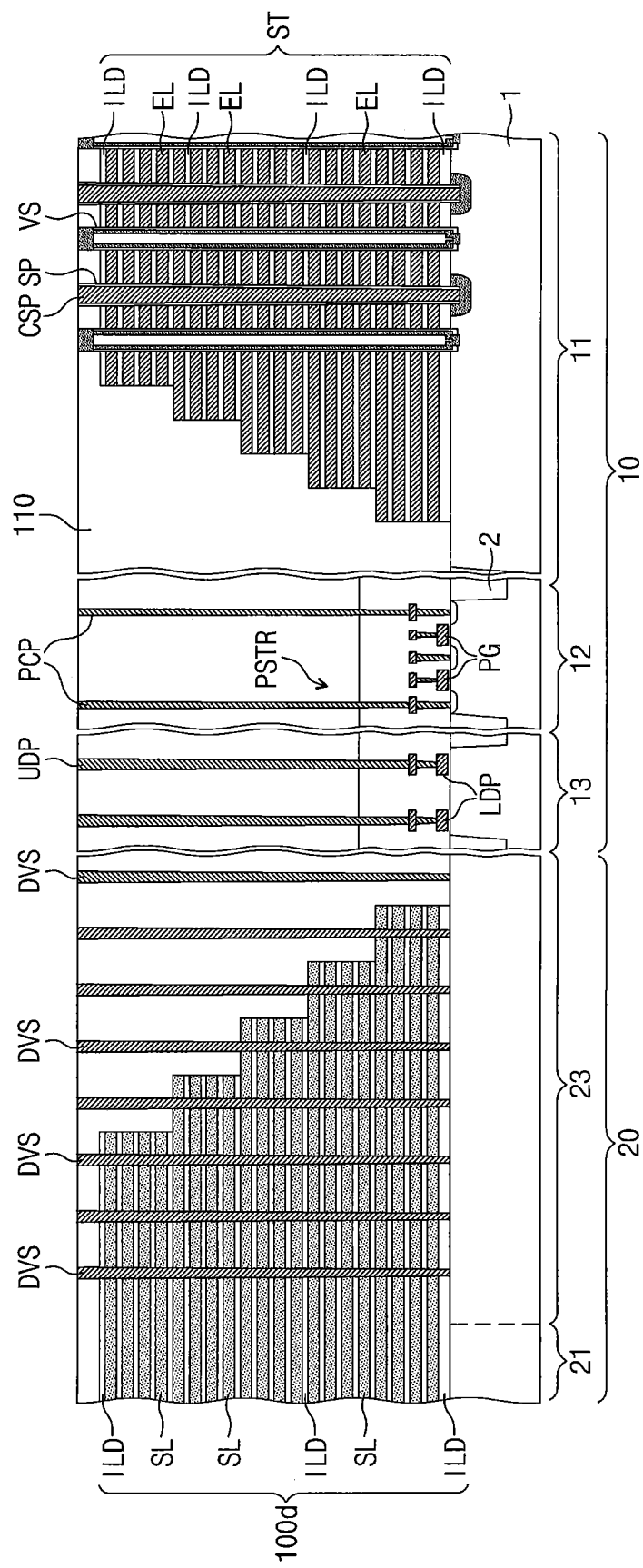

Referring to FIGS. 4 and 5E, electrodes EL may be formed in the gate regions GR, respectively. A gate conductive layer may be formed in the trenches to fill the gate regions, and the gate conductive layer in the trenches may be etched to form the electrodes EL. The gate conductive layer may partially or completely fill the trenches. In some embodiments, forming the gate conductive layer may include sequentially depositing a barrier metal layer and a metal layer. For example, the barrier metal layer may be formed of a metal nitride layer such as a titanium nitride (TiN) layer, a tantalum nitride (TaN) layer, or a tungsten nitride (WN) layer. For example, the metal layer may be formed of a metal material such as tungsten (W), aluminum (Al), titanium (Ti), tantalum (Ta), cobalt (Co), or copper (Cu).

In some embodiments, a horizontal insulating layer (see HP of FIG. 6A) may be formed to conformally cover inner surfaces of the gate regions GR before the formation of the electrodes EL. The horizontal insulating layer may be divided into horizontal insulating patterns HP respectively disposed in the gate regions GR. The horizontal insulating pattern HP may be formed to have a substantially uniform thickness on inner surfaces of the gate regions GR. In some embodiments, the horizontal insulating pattern HP may be a portion of a data storage layer of a charge trap-type flash memory transistor and will be described in more detail with reference to FIGS. 6A to 6C.

The electrodes EL may be formed in the gate regions as described above, and thus stack structures ST may be formed on the cell array region 11 of the substrate 1. Ones of the stack structures ST may include the insulating layers ILD and the electrodes EL that are alternately and repeatedly stacked on the substrate 1. The stack structure ST of the cell array region 11 may be defined as a cell stack structure ST. The stack structures ST may extend in one direction, and sidewalls of the stack structures ST may be exposed through the trenches T. In addition, the substrate 1 may be exposed between the stack structures ST adjacent to each other. The stack structure ST may have a stepwise structure on an edge region of the cell array region 11. In some embodiments, the number of the electrodes EL included in each of the stack structures ST may be equal to the number of the sacrificial layers SL included in the dummy mold structure 100d.

Referring again to FIGS. 4 and 5E, insulating spacers SP and a common source plug CSP may be formed in each of the trenches.

Forming the insulating spacers may include depositing a spacer layer with a uniform thickness on the substrate 1 having the stack structures ST, and performing an etch-back process on the spacer layer to expose a common source region CSR. Here, the spacer layer may be formed of an insulating material, and a thickness of the spacer layer deposited on an inner sidewall of the trench may be equal to or smaller than about a half of the minimum width of the trench. For example, the spacer layer may include at least one of a silicon oxide layer, a silicon nitride layer, a silicon oxynitride layer, or a low-k dielectric layer having a low dielectric constant. The insulating spacers SP may cover the inner sidewalls of the trenches.

The common source plug CSP may completely fill each of the trenches in which the insulating spacers are formed. The common source plug CSP may be disposed between the electrodes EL laterally adjacent to each other, and the insulating spacers SP may be disposed between the common source plug CSP and the electrodes EL. In other words, the insulating spacers SP may cover sidewalls of the common source plug CSP. In addition, the common source plug CSP may extend in parallel to the electrodes EL along one direction.

Meanwhile, the common source regions CSR may be formed in the substrate 1 exposed by the trenches. The common source regions CSR may extend in parallel to the stack structures ST in one direction and may be connected to the common source plugs CSP, respectively. The common source regions CSR may be formed by doping the substrate 1 with dopants having a different conductivity type from the substrate 1.

In some embodiments, after or before the formation of the common source plugs CSP, one or more peripheral buried contact plugs PCP and/or upper dam patterns UDP may be formed on the peripheral circuit region 12 and the dam region 13, respectively. In addition, dummy vertical structures DVS may be formed on the scribe line region 20. In some embodiments, the peripheral buried contact plug PCP, the upper dam pattern UDP, and the dummy vertical structures DVS may be formed simultaneously with the common source plugs CSP.

The peripheral buried contact plugs PCP may be electrically connected to the peripheral logic structure PSTR, and the upper dam patterns UDP may be electrically connected to the lower dam pattern LDP. The one or more upper dam patterns UDP may be formed to have ring shapes extending along an edge of each of the chip regions 10 when viewed from a plan view.

In some embodiments, the dummy vertical structures DVS may penetrate the dummy mold structure 100d on the scribe line region 20 of the substrate 1.

In some embodiments, forming dummy vertical structures DVS may include forming dummy holes penetrating the dummy mold structure 100d and filling the dummy holes with a filling material. Here, at least some of the dummy holes may respectively penetrate the pad portions of the dummy mold structure 100d to expose the substrate 1. The top surface of the substrate 1 exposed through the dummy holes may be recessed by a predetermined depth by over-etching during the etching process for forming the dummy holes.

The dummy vertical structures DVS may be formed of a different material from the insulating layers ILD and the sacrificial layers SL of the dummy mold structure 100d. In some embodiments, the dummy vertical structures DVS may include at least one of a semiconductor material, a conductive material, or a dielectric material. For example, the dummy vertical structures DVS may include at least one of a metal material (e.g., W, Al, Ti, Ta, Co, or Cu), silicon nitride, silicon oxide, a high-k dielectric material, or polysilicon.

In some embodiments, the dummy vertical structures DVS may be formed of a different material from the vertical structures VS of the cell array region 11. For example, the vertical structures VS may include a semiconductor material, and the dummy vertical structures DVS may include a conductive material. In some embodiments, the dummy vertical structures DVS may be formed simultaneously with the peripheral buried contact plugs PCP.

In some embodiments, the dummy vertical structures DVS may be substantially vertical to the top surface of the substrate 1 and may be in contact with the substrate 1. Top surfaces of the dummy vertical structures DVS may be substantially coplanar with each other. In other words, vertical lengths of the dummy vertical structures DVS may be substantially equal to each other. Since the dummy mold structure 100d may have the stepwise structure, the numbers of the sacrificial layers SL which the dummy vertical structures DVS penetrate may sequentially decrease as a horizontal distance from the chip region 10 decreases. In some embodiments, one or more of the dummy vertical structures DVS may not penetrate the dummy mold structure 100d but may penetrate the filling insulation layer 110 so as to be in contact with the substrate 1.

In some embodiments, the dummy vertical structures DVS may have linear shapes, bar shapes, or pillar shapes. These will be described in detail with reference to FIGS. 8A to 8D.

Figure 5F:
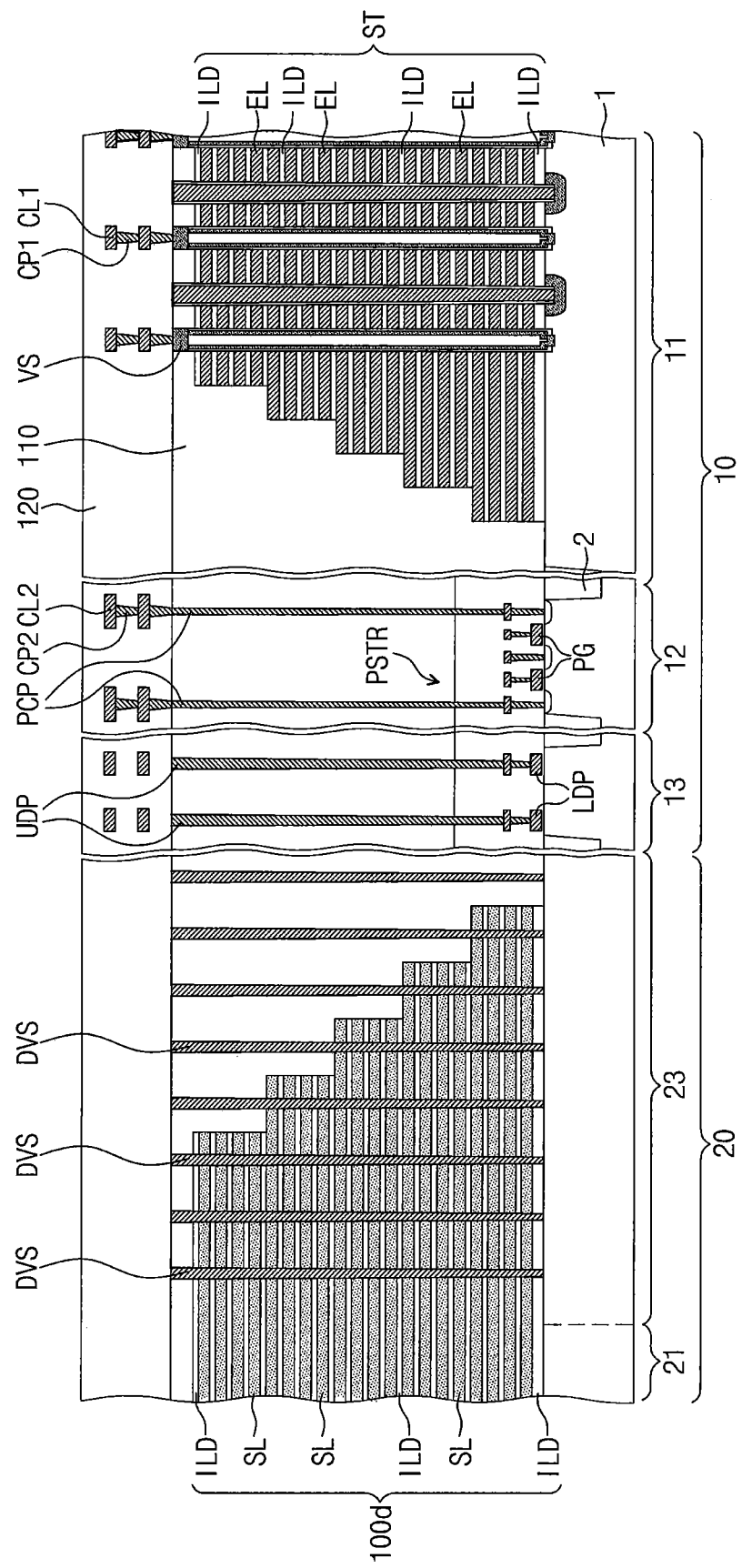

Referring to FIGS. 4 and 5F, cell contact plugs CP1 and cell interconnections CL1 that are electrically connected to the vertical structures VS may be formed on the filling insulation layer 110 of the cell array region 11. Peripheral contact plugs CP2 and peripheral interconnections CL2 that are electrically connected to the peripheral logic circuits may be formed on the filling insulation layer 110 of the peripheral circuit region 12.

In addition, an upper insulating layer 120 may be formed on the filling insulation layer 110. The upper insulating layer 120 may cover the cell contact plugs CP1, the cell interconnections CL1, the peripheral contact plugs CP2, and the peripheral interconnections CL2. The upper insulating layer 120 may also cover the top surfaces of the dummy vertical structures DVS of the scribe line region 20.

Figure 5G:
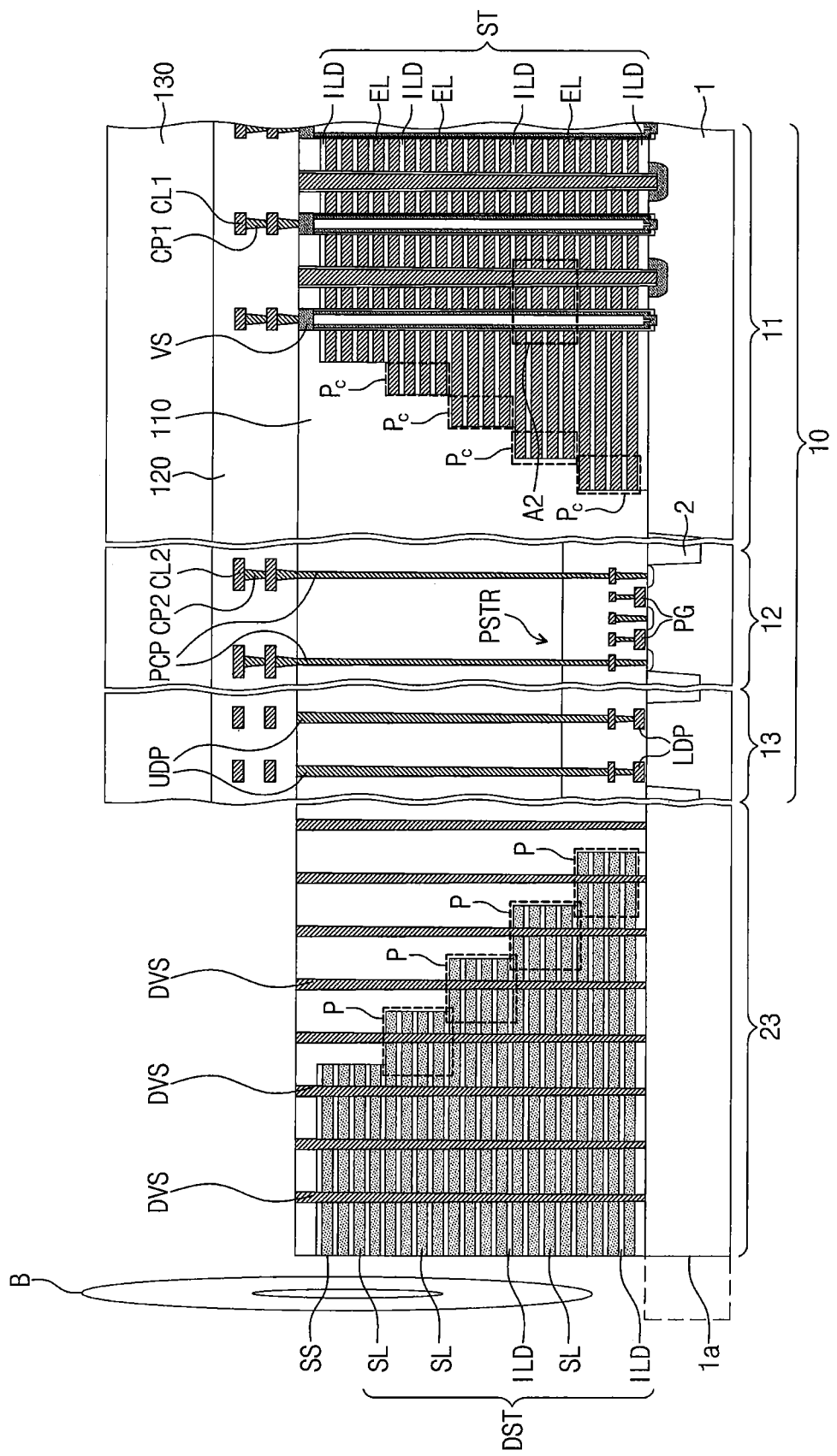

Referring to FIGS. 4 and 5G, a passivation pattern 130 may be formed to cover the upper insulating layer 120 of each of the chip regions 10 of the substrate 1. The upper insulating layer 120 may be etched using the passivation patterns 130 as etch masks to expose the dummy vertical structures DVS of the scribe line region 20. In some embodiments, the passivation pattern 130 may be formed, for example, of an epoxy polymer or polyimide.

Subsequently, a sawing process may be performed on the substrate 1 to separate the chip regions 10, on which the semiconductor integrated circuits are integrated, from each other. Thus, a plurality of semiconductor chips separated from each other may be formed from one substrate 1. In the sawing process, the substrate 1 may be sawed along the cutting region 21 of the scribe line region 20, for example, by a blade B or laser. In some embodiments, the blade B may be moved along a first direction D1 and a second direction D2 during the sawing process to separate the plurality of semiconductor chips from each other.

Sidewalls 1a and 1b of the quadrilateral semiconductor chip may be defined by cut surfaces of the substrate 1 cut by the blade B. In other words, after the sawing process, the substrate 1 of the semiconductor chip may have first sidewalls 1a opposite to each other and second sidewalls 1b substantially perpendicular to the first sidewalls 1a, as illustrated in FIG. 4.

In addition, a portion of the dummy mold structure 100d on the cutting region 21 of the scribe line region 20 may be removed by the sawing process to form a dummy stack structure DST on the edge region 23 of the scribe line region 20. The dummy stack structure DST remaining on the edge region 23 of the scribe line region 20 after the sawing process may have a sidewall SS that is substantially perpendicular to the top surface of the substrate 1 and is aligned with the first sidewall 1a of the substrate 1. In other words, the sidewall SS of the dummy stack structure DST may be substantially coplanar with the first sidewall 1a of the substrate 1. In some embodiments, another sidewall of the dummy stack structure DST, which is adjacent to the chip region 10, may have a stepwise profile.

Alternatively, in some embodiments, the another sidewall of the dummy stack structure DST, which is adjacent to the chip region 10, may be substantially perpendicular to the top surface of the substrate 1, as illustrated in FIG. 18. In other words, the sacrificial layers SL of the dummy stack structure DST may have the substantially same planar area, and sidewalls of the sacrificial layers SL of the dummy stack structure DST may be vertically aligned with each other.

In some embodiments, as illustrated in FIG. 4, the dummy stack structure DST may be disposed on the scribe line region 20 between the chip regions 10 adjacent to each other in the first direction D1. However, embodiments of the inventive concepts are not limited thereto. In some embodiments, the dummy stack structure DST may be disposed on the scribe line region 20 between the chip regions 10 adjacent to each other in the second direction D2.

In some embodiments, the dummy vertical structures DVS disposed on the edge region 23 of the scribe line region 20 may prevent a crack generated when sawing the substrate 1 from propagating to the cell array structure including the memory cells three-dimensionally arranged.

Figure 6A:
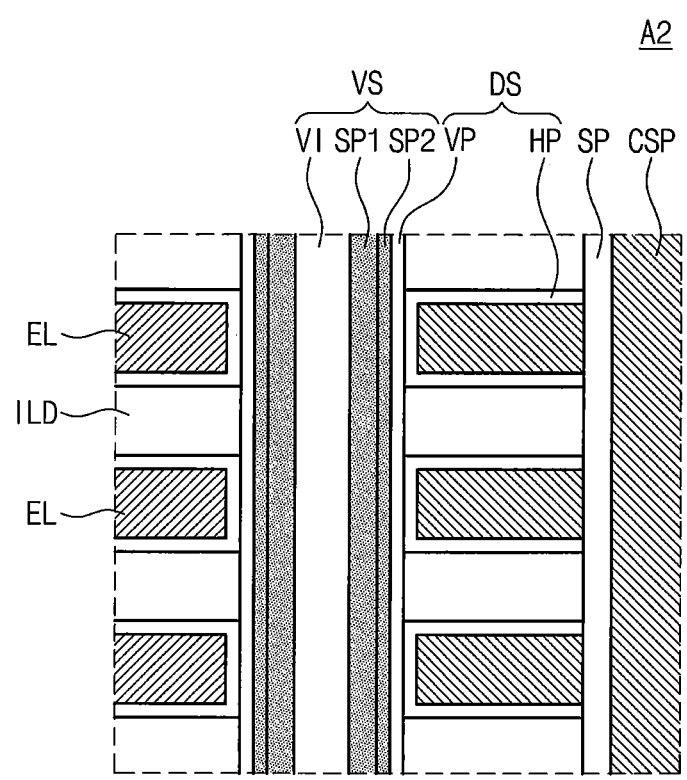
FIGS. 6A, 6B, and 6C are enlarged views of a portion 'A2' of FIG. 5G.
Figure 6B:
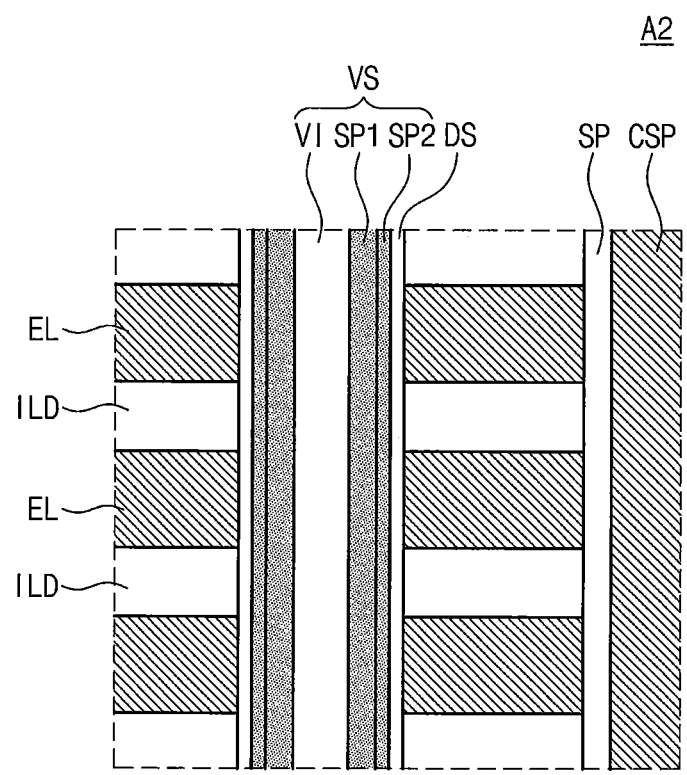
Figure 6C:
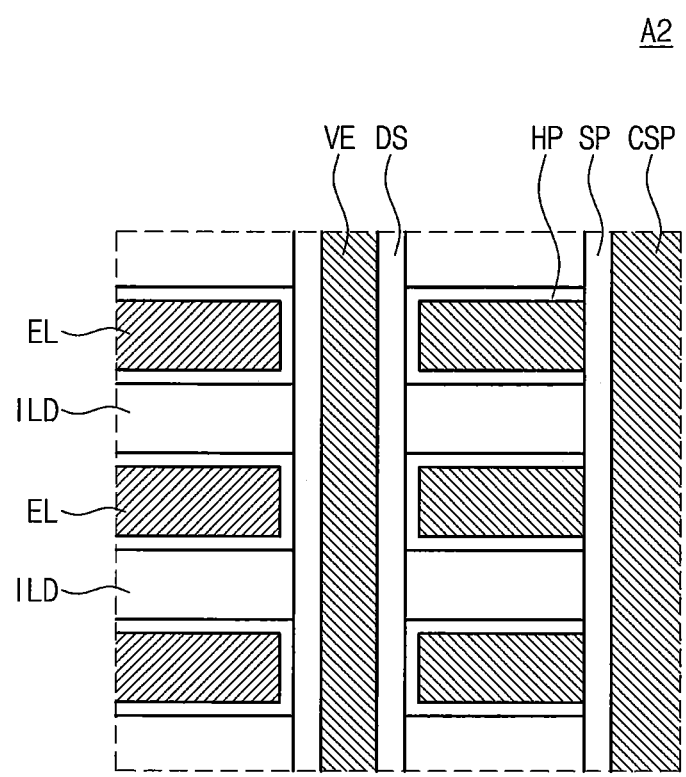

FIGS. 6A, 6B, and 6C are enlarged views of a portion 'A' of FIG. 5G, according to some embodiments of the inventive concepts.

3D semiconductor devices according to some embodiments, as illustrated in FIGS. 6A and 6B, may be, for example. NAND flash memory devices. For example, a data storage layer DS may include a trap site-rich insulating layer (e.g., a silicon nitride layer), a floating gate electrode, or an insulating layer including conductive nano dots. Data stored in the data storage layer DS may be changed by the Fowler-Nordheim tunneling induced by a difference in voltage between the electrode EL and the vertical structure VS including the semiconductor material. For example, the data storage layer DS disposed between the stack structure ST and the vertical structure VS may include a tunnel insulating layer, a charge storage layer, and a blocking insulating layer.

Referring to FIG. 6A, ones of the vertical structures VS may each include a first semiconductor pattern SP1 being in contact with the substrate 1, a second semiconductor pattern SP2 disposed between the first semiconductor pattern SP1 and the data storage layer DS, and a filling insulation pattern VI filling an inner space surrounded by the first semiconductor pattern SP1.

The first semiconductor pattern SP1 may have a cylindrical pillar shape. Alternatively, the first semiconductor pattern SP1 may have a hollow pipe or macaroni shape. A bottom end of the first semiconductor pattern SP1 may be in a closed state, and the inner space of the first semiconductor pattern SP1 may be filled with the filling insulation pattern VI. The first semiconductor pattern SP1 may be in contact with an inner sidewall of the second semiconductor pattern SP2 and the top surface of the substrate 1. In other words, the first semiconductor pattern SP1 may electrically connect the second semiconductor pattern SP2 to the substrate 1. A bottom surface of the first semiconductor pattern SP1 may be disposed at a lower level than the top surface of the substrate 1. The second semiconductor pattern SP2 may have a pipe or macaroni shape of which top and bottom ends are opened. The first and second semiconductor patterns SP1 and SP2 may be undoped or may be doped with dopants having the same conductivity type as the substrate 1. The first and second semiconductor patterns SP1 and SP2 may be in a poly-crystalline state or a single-crystalline state.

The data storage layer DS may be disposed between the stack structure ST and the vertical structure VS. In some embodiments, the data storage layer DS may include a vertical insulating pattern VP penetrating the stack structure ST and a horizontal insulating pattern HP extending from between the vertical insulating pattern VP and each of the electrodes EL onto top and bottom surfaces of each of the electrodes EL, as illustrated in FIG. 6A. In some embodiments, the vertical insulating pattern VP of the data storage layer DS may extend from between the vertical structure VS and the electrodes EL into between the vertical structure VS and the insulating layers ILD. In some embodiments, the vertical insulating pattern VP may be formed of a single layer or a multi-layer. The horizontal insulating pattern HP may be formed of a single layer or a multi-layer.

In some embodiments, the vertical insulating pattern VP may include the tunnel insulating layer and the charge storage layer, and the horizontal insulating pattern HP may include the blocking insulating layer. In some embodiments, the vertical insulating pattern VP may include the tunnel insulating layer, the charge storage layer, and a first blocking insulating layer, and the horizontal insulating pattern HP may include a second blocking insulating layer.

Referring to FIG. 6B, the data storage layer DS may extend from between the vertical structure VS and the electrodes EL into between the vertical structure VS and the insulating layers ILD. In addition, the top surfaces and the bottom surfaces of the electrodes EL may be in direct contact with the insulating layers ILD.

In some embodiments, as illustrated in FIG. 6C, a 3D semiconductor device be, for example, a variable resistance memory device including a variable resistance material. In detail, a vertical electrode VE penetrating the stack structure including the vertically stacked electrodes EL may correspond to the vertical structure, and the data storage layer DS may be disposed between the vertical electrode VE and the electrodes EL. Here, the data storage layer DS may include a thin layer for a phase-change memory cell or a thin layer for a variable resistance memory cell.

Figure 7A:
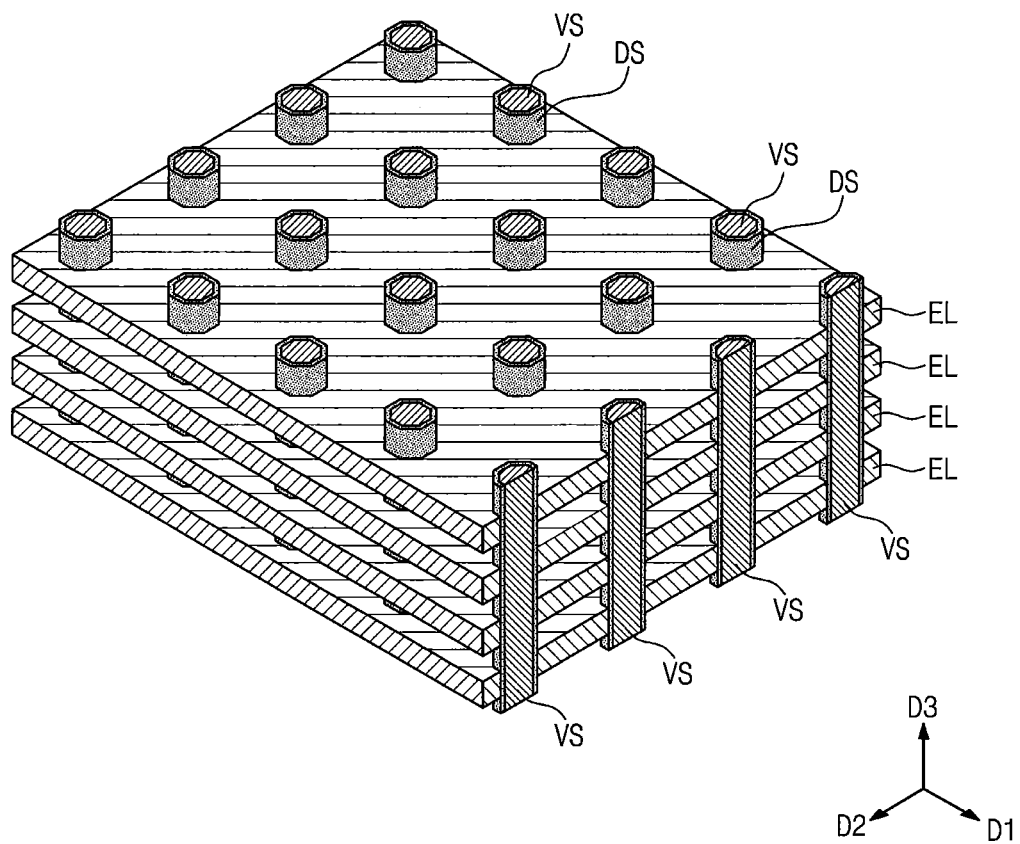
FIGS. 7A and 7B are perspective views illustrating cell array structures of 3D semiconductor devices according to some embodiments of the inventive concepts.
Figure 7B:
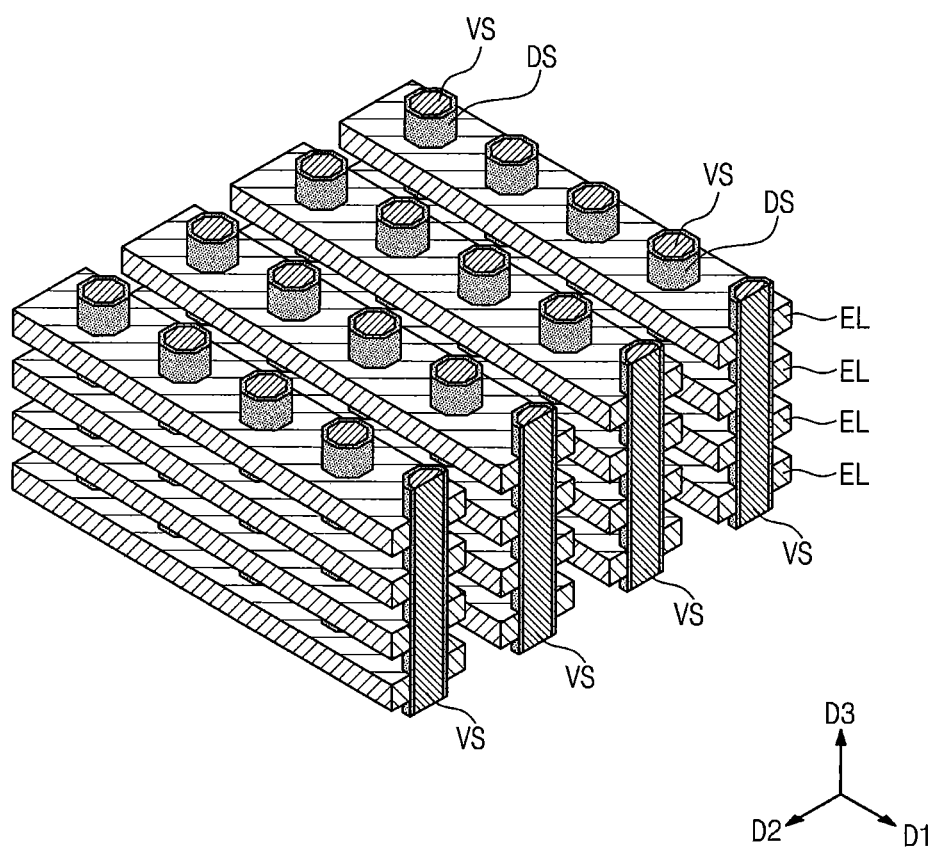

FIGS. 7A and 7B are perspective views illustrating cell array structures of 3D semiconductor devices according to some embodiments of the inventive concepts.

The cell array structure according to some embodiments of the inventive concepts may include a plurality of the electrodes EL disposed at different levels from the top surface of the substrate 1 and a plurality of the vertical structures VS extending in a third direction D3 perpendicular to the first and second directions D1 and D2 to intersect the electrodes EL, as described with reference to FIGS. 5A to 5G. In addition, the cell array structure may further include the data storage layer DS disposed between sidewalls of the vertical structures VS and the electrodes EL. The cell array structure may include the memory cells three-dimensionally arranged as described with reference to FIGS. 3A to 3C.

In some embodiments, ones of the electrodes EL may each have a plate shape as illustrated in FIG. 7A. For example, lengths in the first and second directions D1 and D2 of each of the electrodes EL may be 10 times or more greater than those of each of the vertical structures VS, respectively, when viewed from a plan view. Ones of the electrodes EL may each have a plurality of holes that penetrate each of the electrodes EL and are two-dimensionally arranged. Each of the vertical structures VS may vertically pass through the holes of the electrodes EL disposed at levels different from each other.

In some embodiments, electrodes EL may be separated from each other in the first, second, and third directions D1, D2, and D3 so as to be three-dimensionally arranged, as illustrated in FIG. 7B. Ones of the electrodes EL may have a linear shape intersecting a plurality of the vertical structures VS. For example, a length of ones of the electrodes EL may be greater than ten times a width of the vertical structure VS, and a width of the ones of the electrodes EL may be smaller than three times the width of the vertical structure VS. The electrodes EL may include a plurality of holes that penetrate the electrodes EL and are one-dimensionally arranged. Each of the vertical structures VS may vertically pass through the holes of the electrodes EL disposed at levels different from each other.

FIGS. 8A to 8E are plan views illustrating embodiments of scribe line regions of substrates on which 3D semiconductor devices according to some embodiments of the inventive concepts are integrated.

Referring to FIGS. 8A to 8D, in some embodiments, a scribe line region between the chip regions 10 may include the cutting region 21 and the edge regions 23 disposed at both sides of the cutting region 21.

In some embodiments, the dummy stack structure DST may be disposed in the cutting region 21 and the edge regions 23 of the scribe line region 20 between the chip regions 10 adjacent to each other in the first direction D1 when viewed from a plan view. As described with reference to FIG. 5G, the dummy stack structure DST may include the insulating layers ILD and the sacrificial layers SL which are alternately stacked on the substrate 1. The dummy stack structure DST may remain in the edge regions 23 in a plan view after the sawing process using the blade B. Thus, the dummy stack structure DST may have the sidewall SS that is substantially perpendicular to the top surface of the substrate 1 and is aligned with the first sidewall 1a of the substrate 1.

In addition, a planar area of the dummy stack structure DST may decrease as a height from the substrate 1 increases. In more detail, the dummy stack structure DST may include first pad portions P1 having a stepwise structure downward in the first direction D1 and second pad portions P2 having a stepwise structure downward in the second direction D2 perpendicular to the first direction D1.

The first pad portions P1 of the dummy stack structure DST may be disposed at different levels from the substrate 1, respectively, as illustrated in FIG. 5G. Like the first pad portions P1, the second pad portions P2 may also be disposed at different levels from the substrate 1, respectively. The sidewalls of the first pad portions P1 may be spaced apart from each other in the first direction D1 when viewed from a plan view, and the sidewalls of the second pad portions P2 may be spaced apart from each other in the second direction D2 when viewed from a plan view.

Figure 8A:
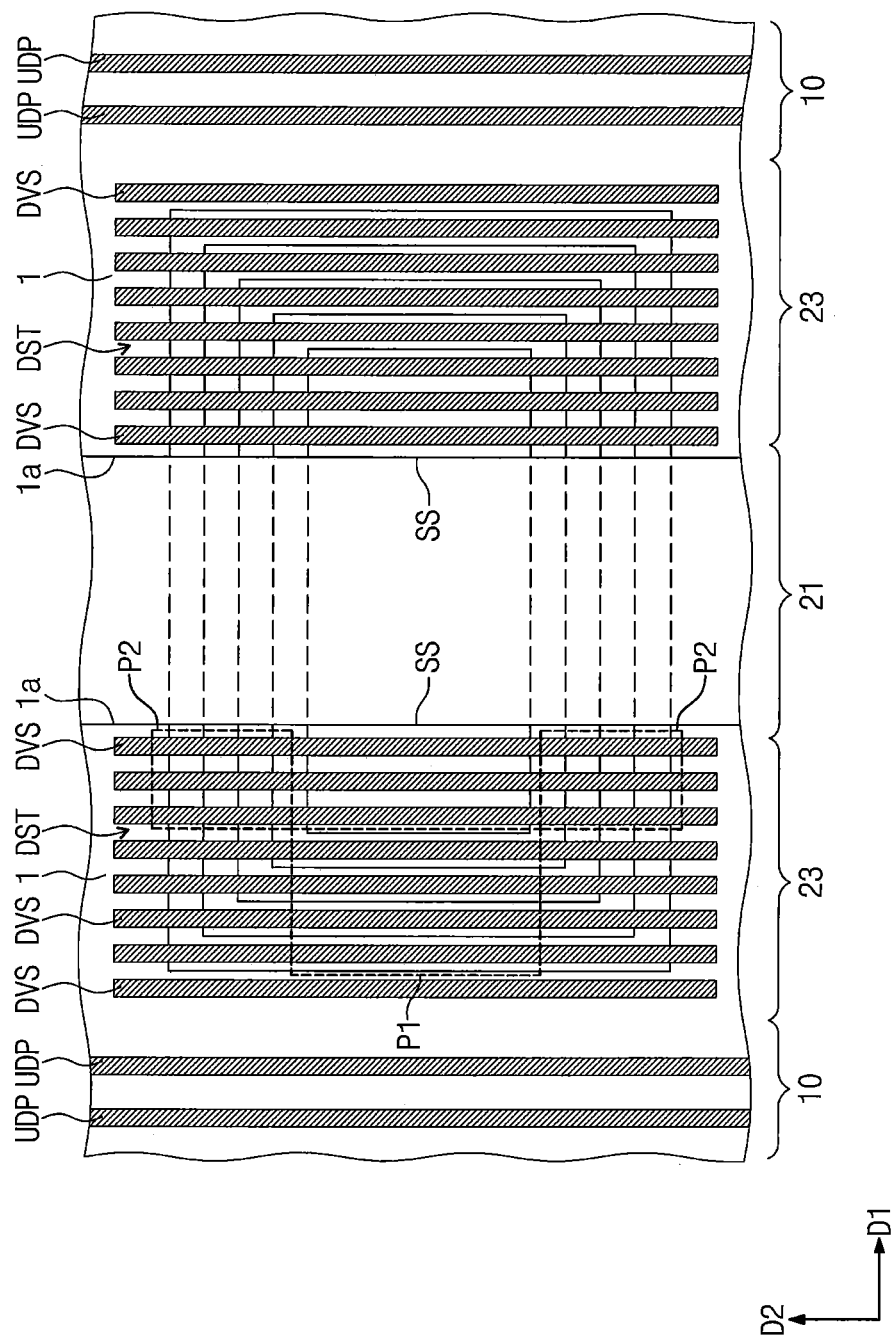
FIGS. 8A to 8E are plan views illustrating embodiments of a scribe line region of a substrate on which 3D semiconductor devices according to some embodiments of the inventive concepts are integrated.

Referring to FIG. 8A, at least some of the dummy vertical structures DVS may penetrate the first pad portions P1 of the dummy stack structure DST, respectively. The dummy vertical structures DVS may have linear shapes that extend in the second direction D2 and are spaced apart from each other in the first direction D1. In other words, the dummy vertical structures DVS may extend parallel to the first sidewall 1a of the substrate 1. At least some of the dummy vertical structures DVS may intersect the first pad portions P1 and may intersect the second pad portions P2. In some embodiments, lengths in the second direction D2 of the dummy vertical structures DVS may be greater than the maximum width in the second direction D2 of the dummy stack structure DST. Thus, the dummy vertical structures DVS may intersect a boundary between the dummy stack structure DST and the substrate 1 when viewed from a plan view.

Figure 8B:
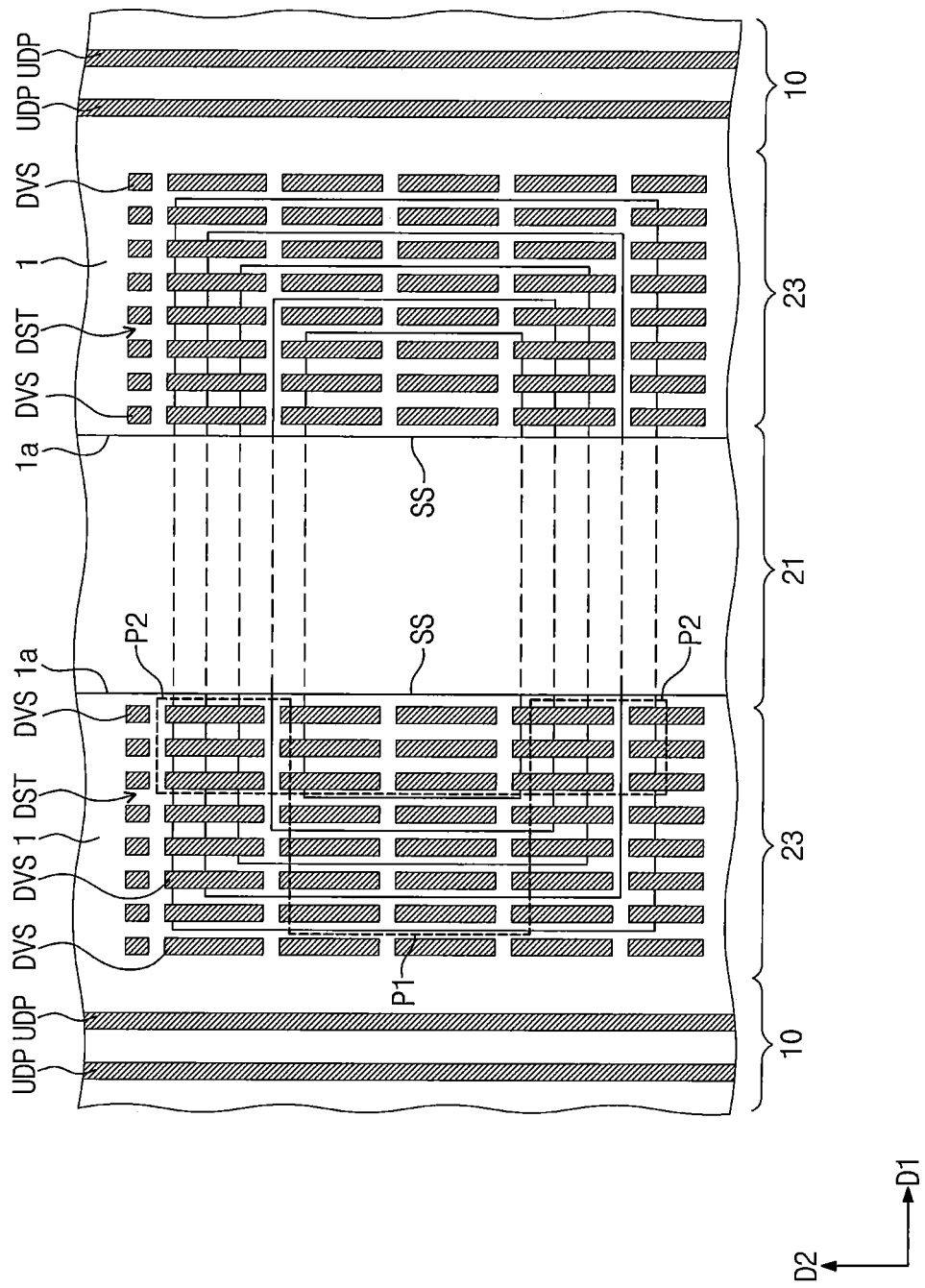
Figure 8C:
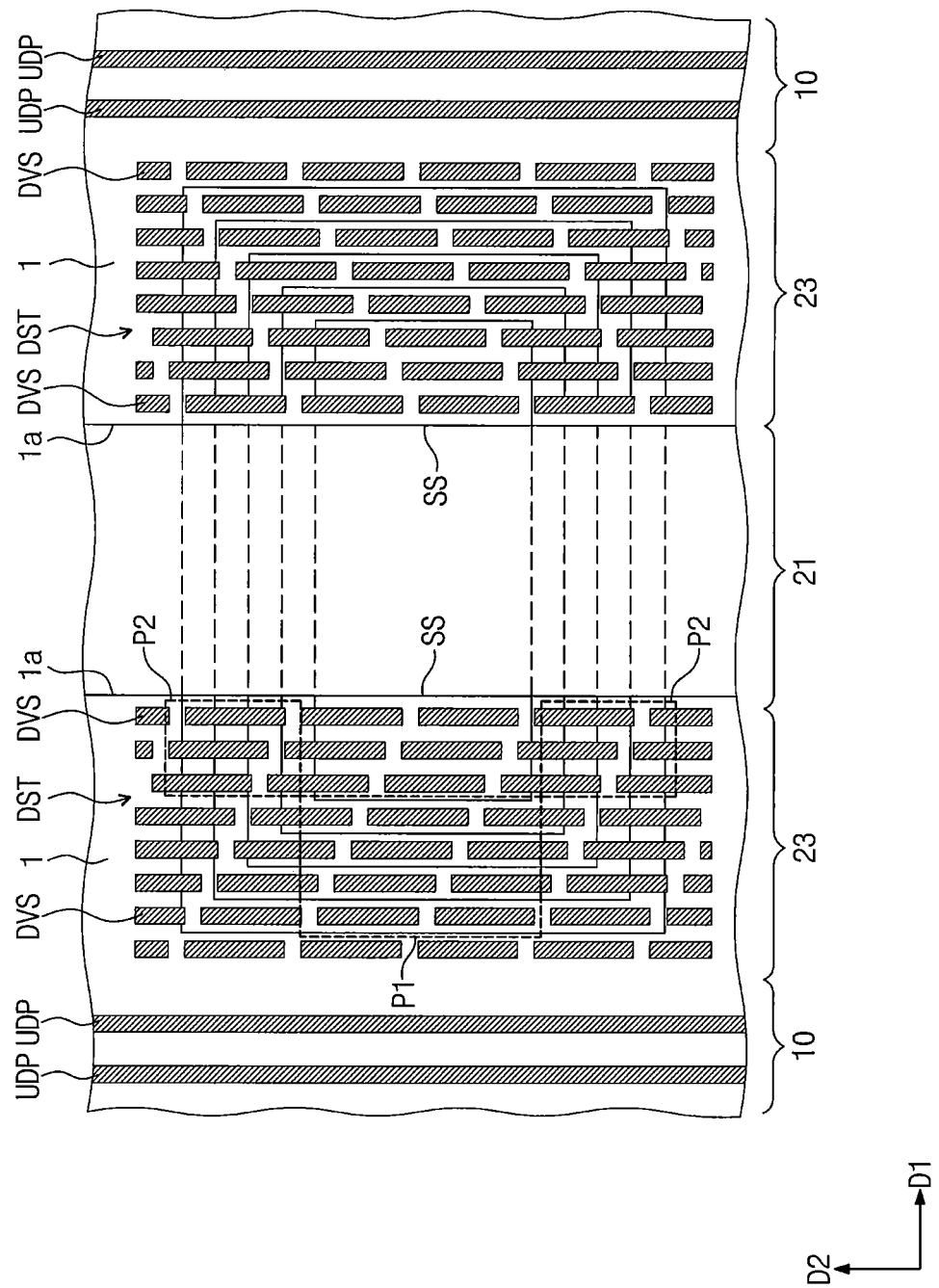

According to some embodiments, as illustrated in FIGS. 8B and 8C, the dummy vertical structures DVS may be spaced apart from each other in the first direction D1 and the second direction D2. In other words, the dummy vertical structures may be two-dimensionally arranged. Ones of the dummy vertical structures DVS may have a bar shape extending in the second direction D2 when viewed from a plan view. In other words, a length in the second direction D2 of a dummy vertical structure DVS may be greater than a width in the first direction D1 of the dummy vertical structure DVS. One or more of the dummy vertical structures DVS may be disposed on the boundary between the dummy stack structure DST and the substrate 1 when viewed from a plan view.

According to the some embodiments, as illustrated in FIG. 8B, ends of the dummy vertical structures DVS may be arranged along the first direction D1 when viewed from a plan view. Alternatively, according to some embodiments, as illustrated in FIG. 8C, ends of the dummy vertical structures DVS may be arranged along a direction diagonal to the first and second directions D1 and D2 when viewed from a plan view. In addition, the dummy vertical structures DVS may be arranged in a zigzag form along the second direction D2 when viewed from a plan view. In other words, ones of the dummy vertical structures DVS may be aligned along the first direction D1, along a direction that is diagonal to the first and second directions D1 and D2, or may be staggered.

Figure 8D:
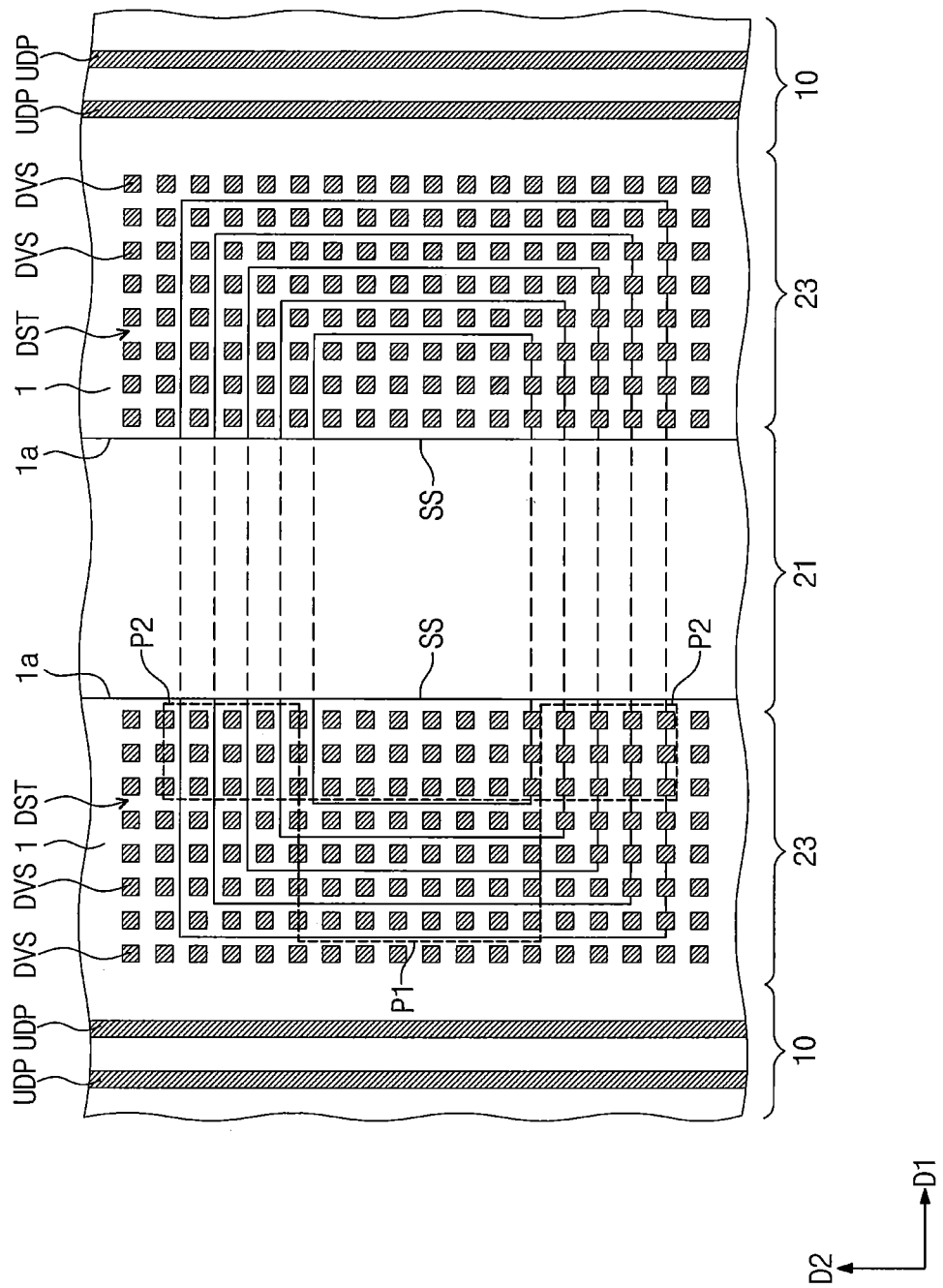

According to some embodiments, as illustrated in FIG. 8D, ones of the dummy vertical structures DVS may have a pillar shape having a first width in the first direction D1 and a second width in the second direction D2. The first width may be substantially equal to the second width. The dummy vertical structures DVS having the pillar shapes may be spaced apart from each other and may be arranged in the first direction D1 and the second direction D2. In other words, the dummy vertical structures may be two-dimensionally arranged. One or more of dummy vertical structures DVS having the pillar shapes may be disposed on the boundary between the dummy stack structure DST and the substrate 1 when viewed from a plan view.

Figure 8E:
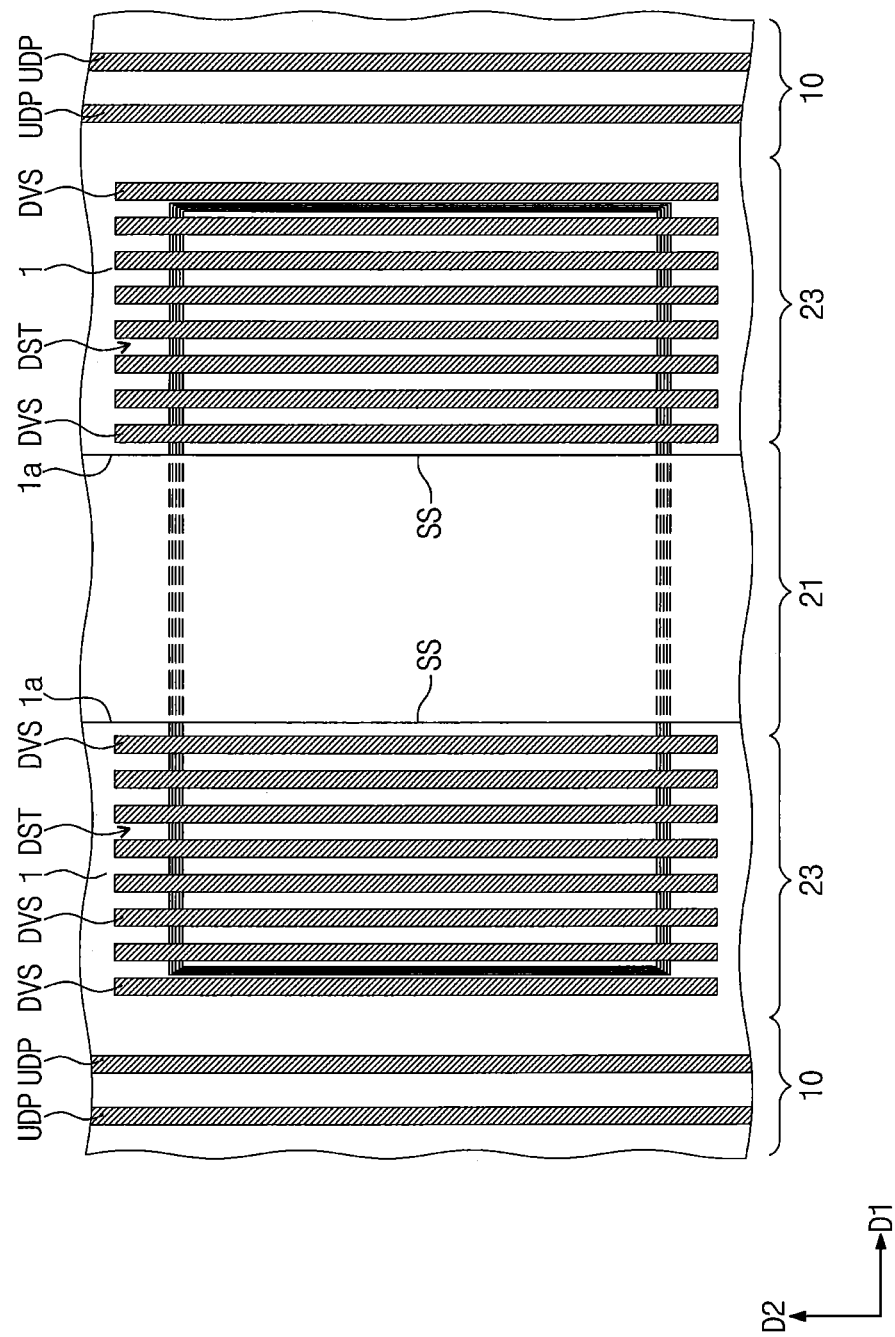

According to some embodiments, as illustrated in FIG. 8E, a sidewall of the dummy stack structure DST, which is adjacent to the chip region 10, may be substantially perpendicular to the top surface of the substrate 1. In other words, the dummy vertical structures DVS may be arranged at equal intervals in the first direction D1, and a height or a vertical thickness of the dummy stack structure DST from a top surface of the substrate 1 which the dummy vertical structures DVS penetrate may be substantially uniform. In other words, the dummy stack structure DST may not include the pad portions having the stepwise structure on the edge region 23.

Figure 15:
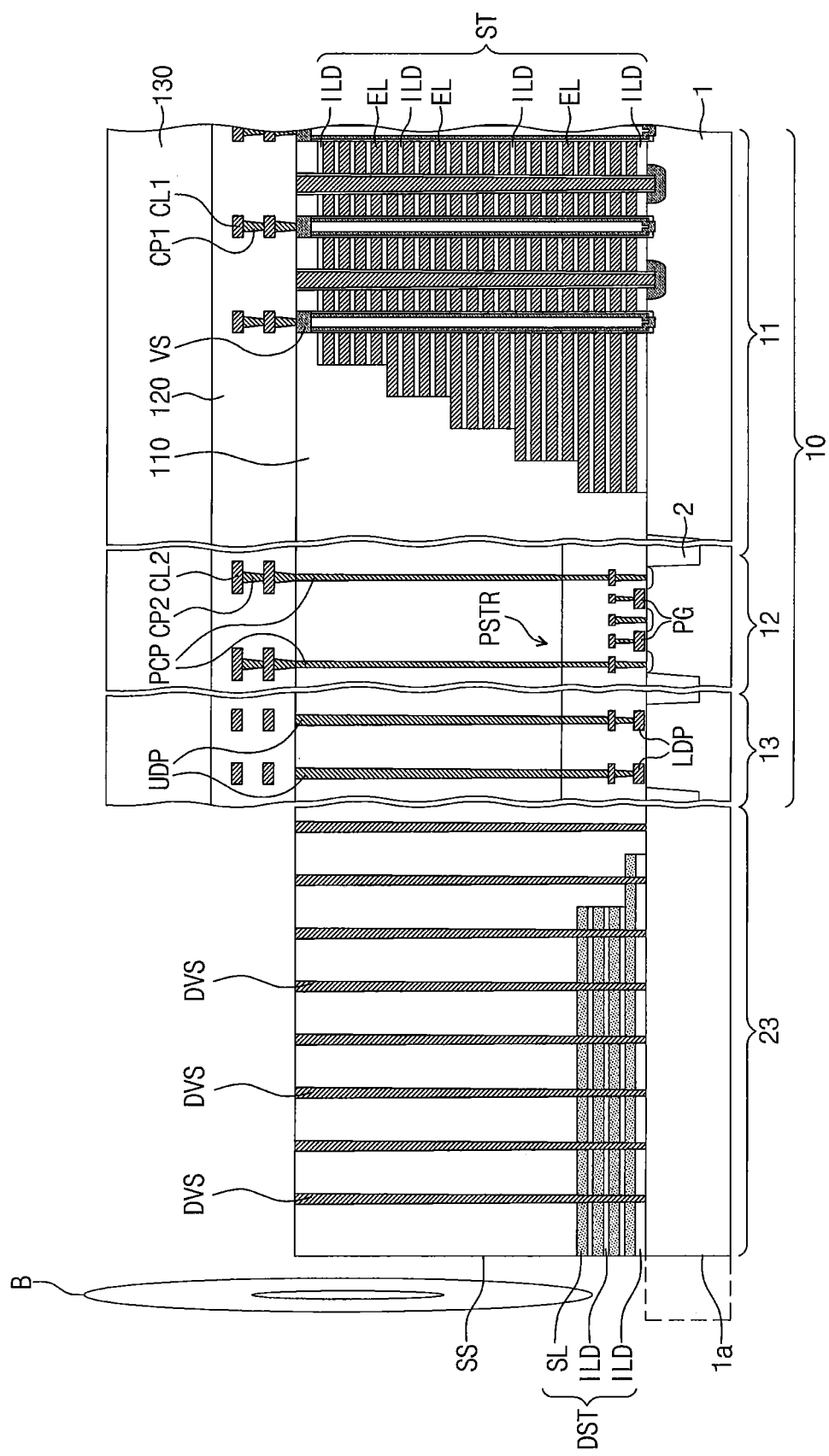
FIGS. 15 to 18 are cross-sectional views illustrating 3D semiconductor devices according to some embodiments of the inventive concepts.
Figure 16:
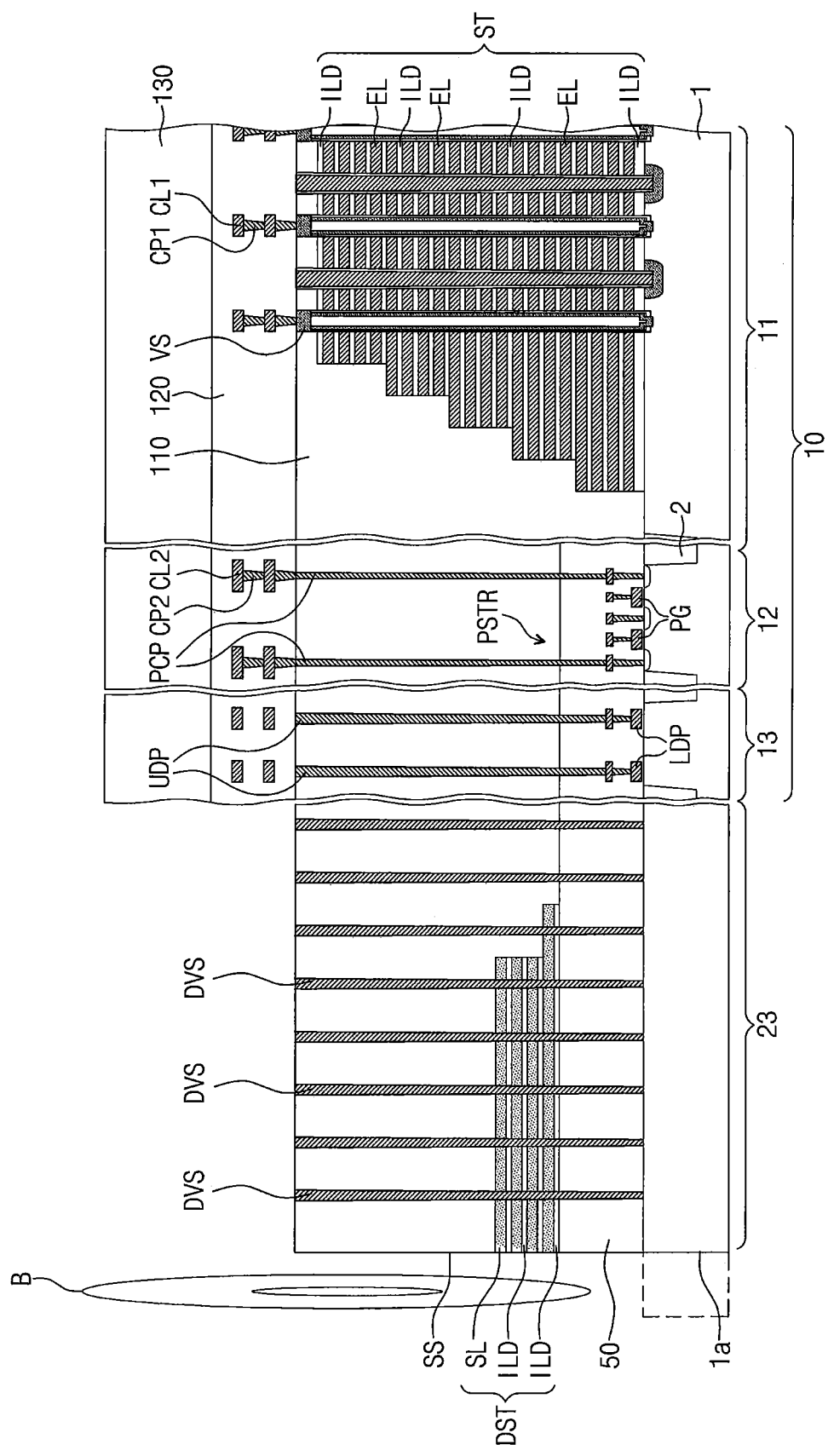
Figure 17:
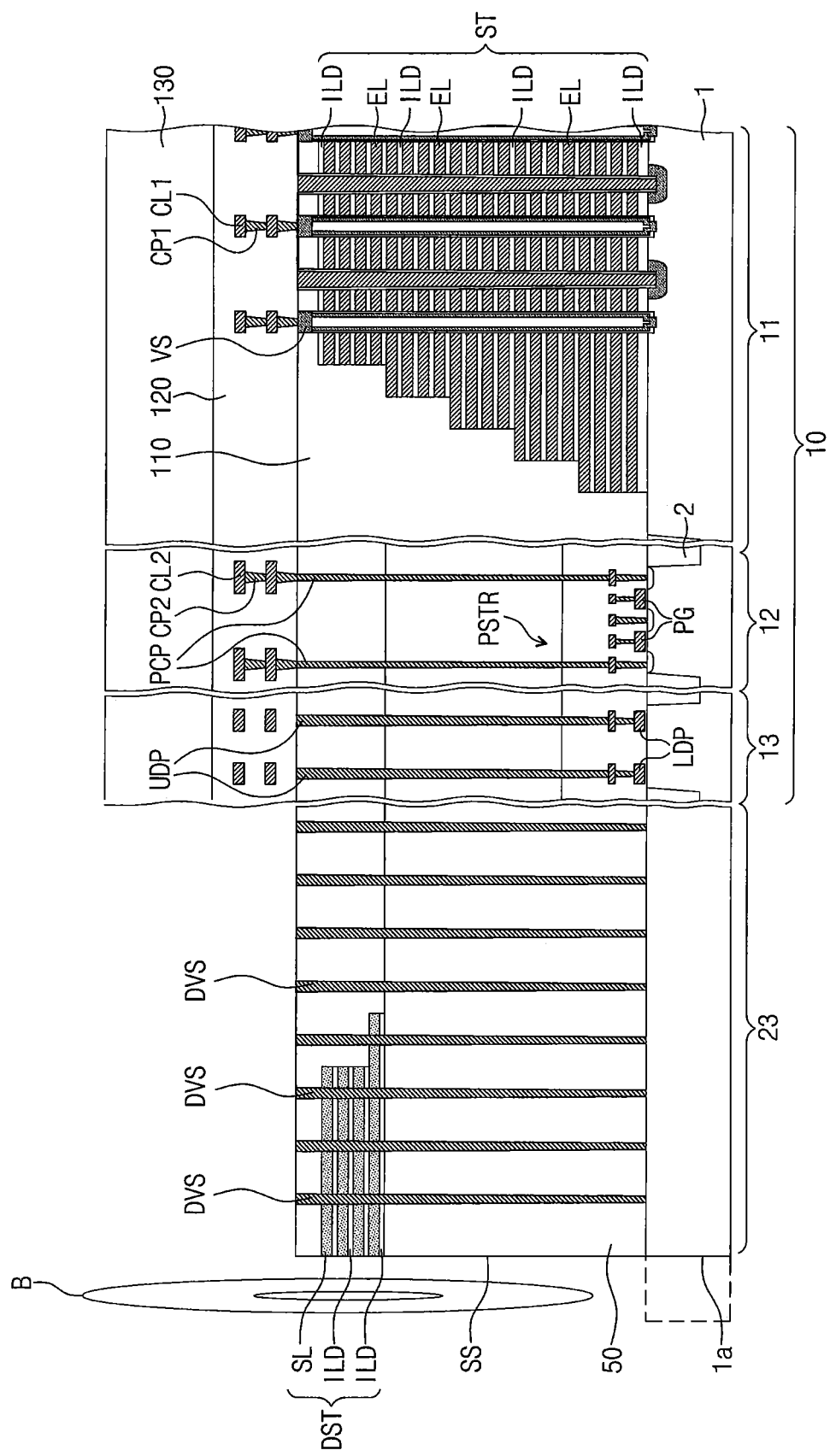

FIGS. 9 to 13 are cross-sectional views illustrating 3D semiconductor devices according to some embodiments of the inventive concepts. FIG. 14 is an enlarged view of a portion 'A3' of FIG. 13. FIGS. 15 to 17 are cross-sectional views illustrating 3D semiconductor devices according to some embodiments of the inventive concepts. In embodiments illustrated in FIGS. 9 to 17, the same elements as described with reference to FIGS. 5A to 5G may be indicated by the same reference numerals or the same reference designators, and the descriptions thereto may be omitted or mentioned briefly for the purpose of ease and convenience in explanation.

Referring to FIGS. 9 to 13, the substrate 1 may include the chip regions 10 and the scribe line region 20 surrounding the chip regions 10. Ones of the chip regions 10 may include the cell array region 11, the peripheral circuit region 12, and the dam region 13, and the scribe line region 20 may include the cutting region 21 and the edge regions 23 disposed at both sides of the cutting region 21.

The cell array structure may be disposed on the cell array region 11 of the substrate 1 and may include the memory cells three-dimensionally arranged as described with reference to FIGS. 3A to 3C. The cell array structure may include the stack structure ST disposed on the substrate 1, the vertical structures VS being vertical to the substrate 1 and penetrating the stack structure ST, and the data storage layer disposed between the stack structure ST and each of the vertical structures VS. Here, the stack structure ST may include the insulating layers ILD and the electrodes EL alternately stacked on the substrate 1, and the vertical structures VS may include a semiconductor material or a conductive material. The stack structure ST may have the stepwise structure of which a height decreases stepwise as a horizontal distance from the scribe line region 20 decreases.

As described with reference to FIG. 5G, the dummy stack structure DST may be disposed on the edge region 23 of the scribe line region 20 after the sawing process. The dummy stack structure DST may include the insulating layers ILD and the sacrificial layers SL alternately stacked on the substrate 1. The dummy stack structure DST may have the stepwise structure of which a height decreases stepwise as a horizontal distance from the chip region 10 decreases.

The peripheral circuit region 12 may be disposed around the cell array region 11, and the peripheral logic structure PSTR may be disposed on the peripheral circuit region 12 of the substrate 1. As described above, the peripheral logic structure PSTR may include NMOS transistors, PMOS transistors, resistors and/or capacitors, which may be electrically connected to the cell array structure.

The dam region 13 may be disposed along the edge of the chip region 10 and may include the lower and upper dam patterns LDP and UDP. As described with reference to FIG. 4, the lower and upper dam patterns LDP and UDP may have the ring shape or the closed-loop shape in a plan view and may penetrate the filling insulation layer 110 which covers the stack structure ST and the dam region 13.

The filling insulation layer 110 may cover the stack structure ST, the dummy stack structure DST, and the peripheral logic structure PSTR, and the top surfaces of the dummy vertical structures DVS may be substantially coplanar with the top surface of the filling insulation layer 110.

Figure 9:
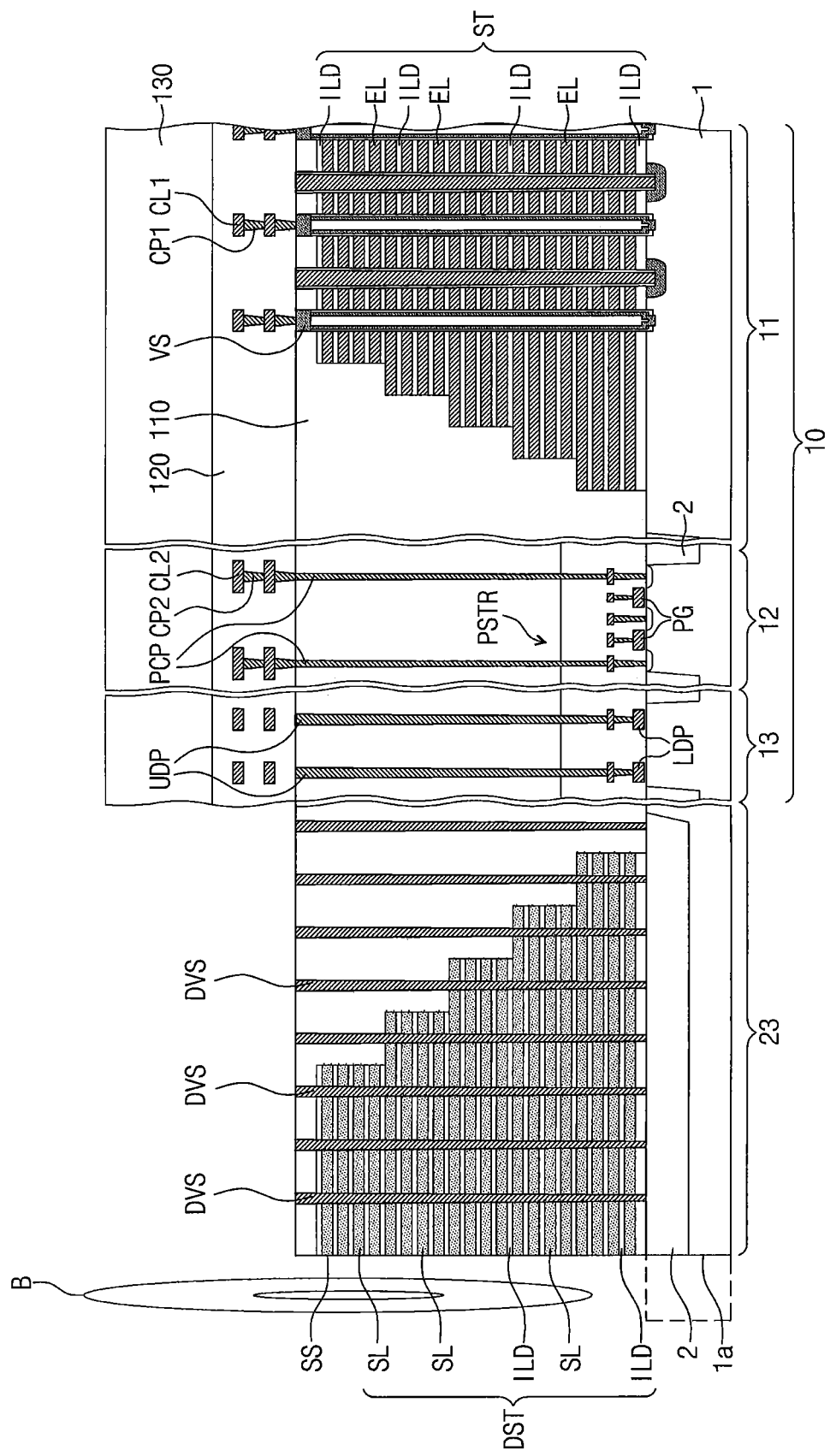
FIGS. 9 to 13 are cross-sectional views illustrating 3D semiconductor devices according to some embodiments of the inventive concepts.

According to some embodiments, as illustrated in FIG. 9, the scribe line region 20 of the substrate 1 may include a device isolation layer 2. The device isolation layer 2 may be formed of an insulating material such as a silicon oxide layer and/or a silicon nitride layer. In such embodiments, the dummy stack structure DST may be disposed on the device isolation layer 2 of the scribe line region 20, and the dummy vertical structures DVS may penetrate the dummy stack structure DST so as to be in contact with the device isolation layer 2. In addition, the top surfaces of the dummy vertical structures DVS may be substantially coplanar with each other.

Figure 10:
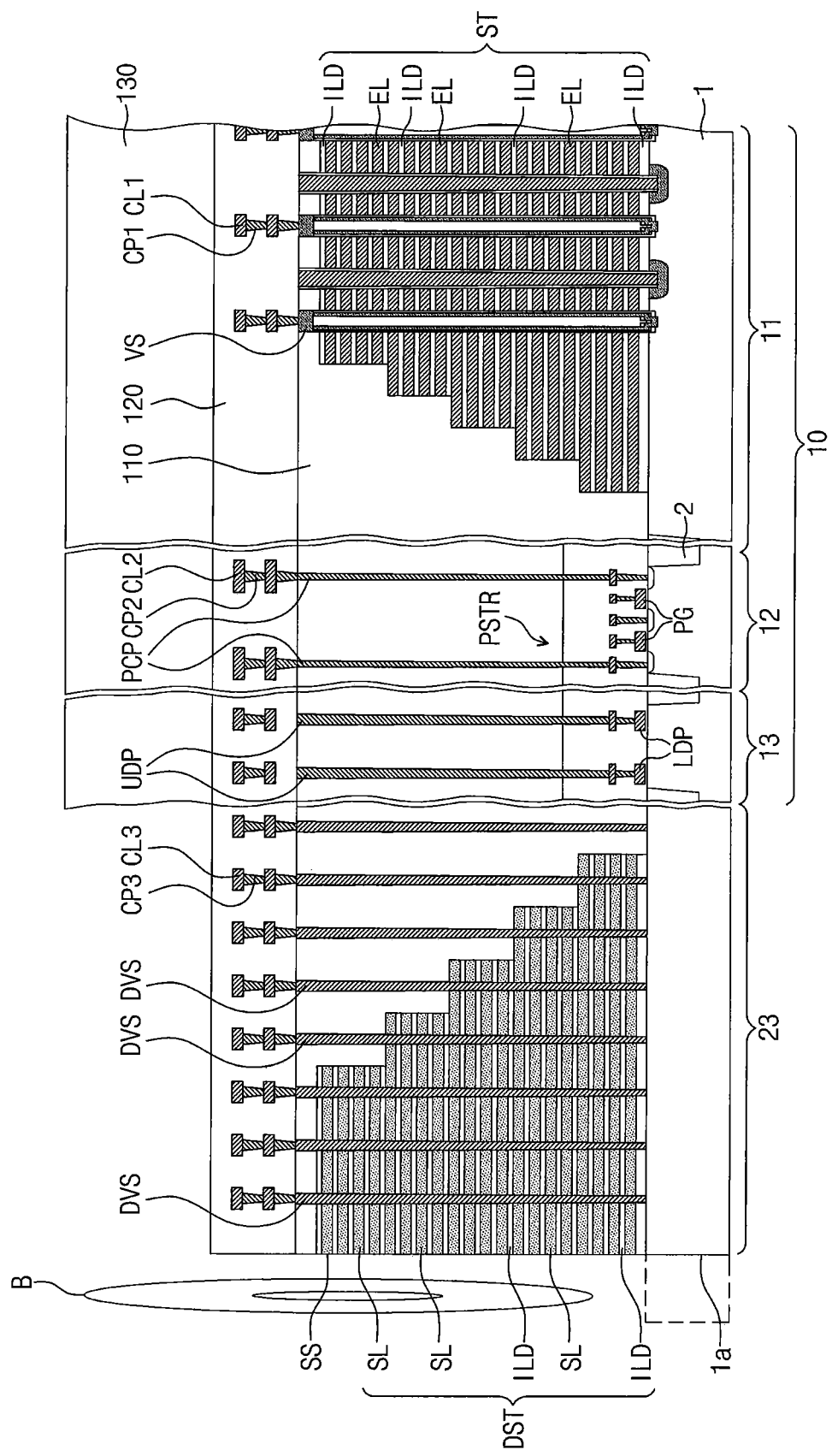

According to some embodiments, as illustrated in FIG. 10, dummy contact plugs CP3 and dummy interconnections CL3 may be disposed on the dummy vertical structures DVS, respectively. The dummy contact plugs CP3 may be formed simultaneously with the cell contact plugs CP1 of the cell array region 11, and the dummy interconnections CL3 may be formed simultaneously with the cell interconnections CL1 of the cell array region 11.

The upper insulating layer 120 may be formed on the filling insulation layer 110. The upper insulating layer 120 may cover the cell contact plugs CP1, the cell interconnections CL1, the peripheral contact plugs CP2, the peripheral interconnections CL2, the dummy contact plugs CP3, and the dummy interconnections CL3. The passivation pattern 130 may be disposed on the upper insulating layer 120 of the chip region 10. The passivation pattern 130 may expose the upper insulating layer 120 of the scribe line region 20.

Figure 11:
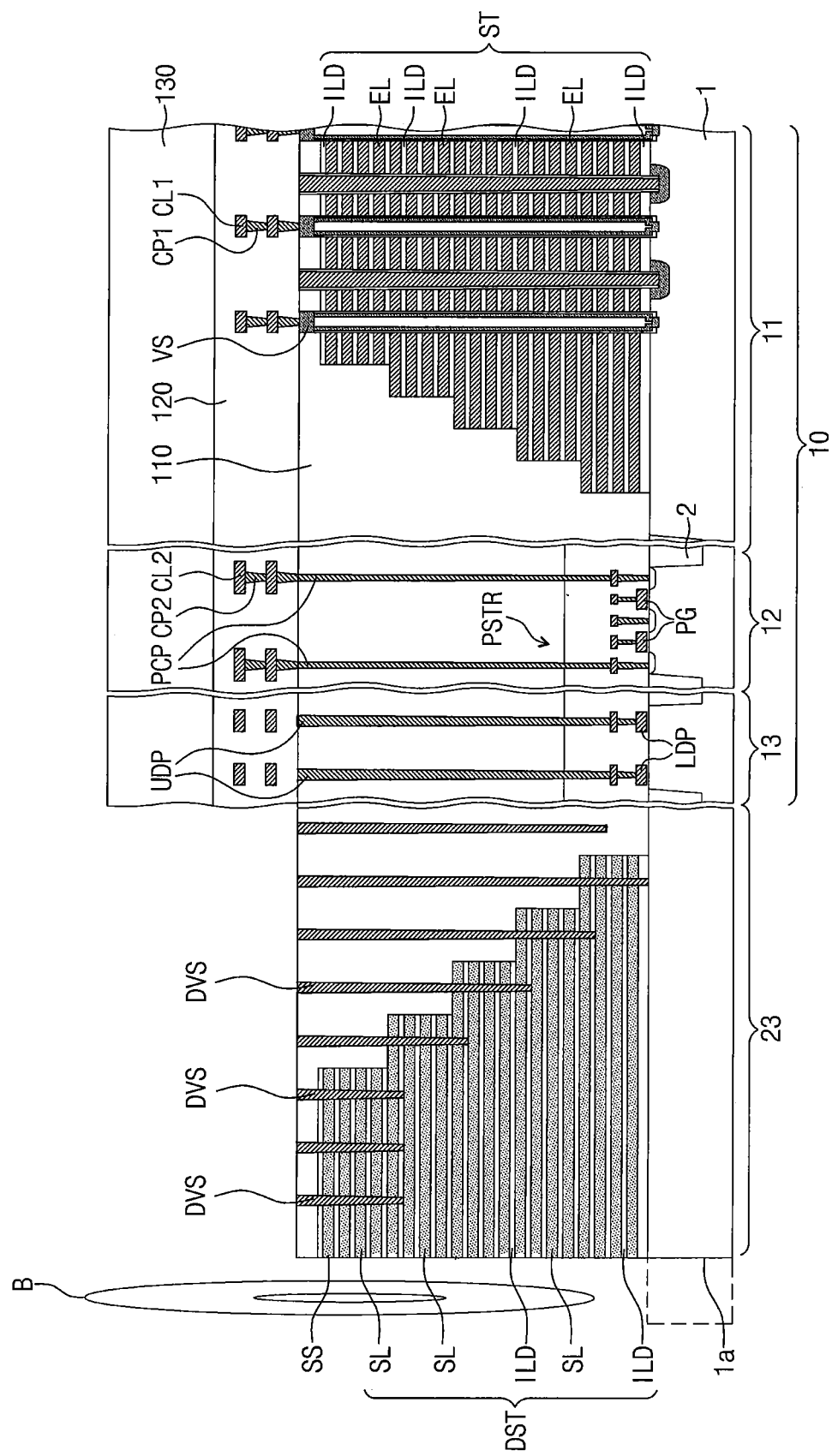

According to some embodiments, as illustrated in FIG. 11, the top surfaces of the dummy vertical structures DVS may be substantially coplanar with each other, but vertical lengths of the dummy vertical structures DVS may be different from each other. In other words, some of the dummy vertical structures DVS may be spaced apart from the top surface of the substrate 1.

In more detail, the dummy stack structure DST may have the stepwise structure of which the height decreases stepwise as a horizontal distance from the chip region 10 decreases. In other words, the dummy stack structure DST may have the pad portions respectively disposed at levels different from each other. The dummy vertical structures DVS may penetrate the pad portions of the dummy stack structure DST, respectively. Here, the numbers of the sacrificial layers SL which the dummy vertical structures DVS penetrate may be equal to each other. In other words, the vertical lengths of the dummy vertical structures DVS may sequentially increase as a horizontal distance from the chip region 10 decreases. In addition, one or more of the dummy vertical structures DVS may not penetrate the dummy stack structure DST on the scribe line region 20.

Figure 12:
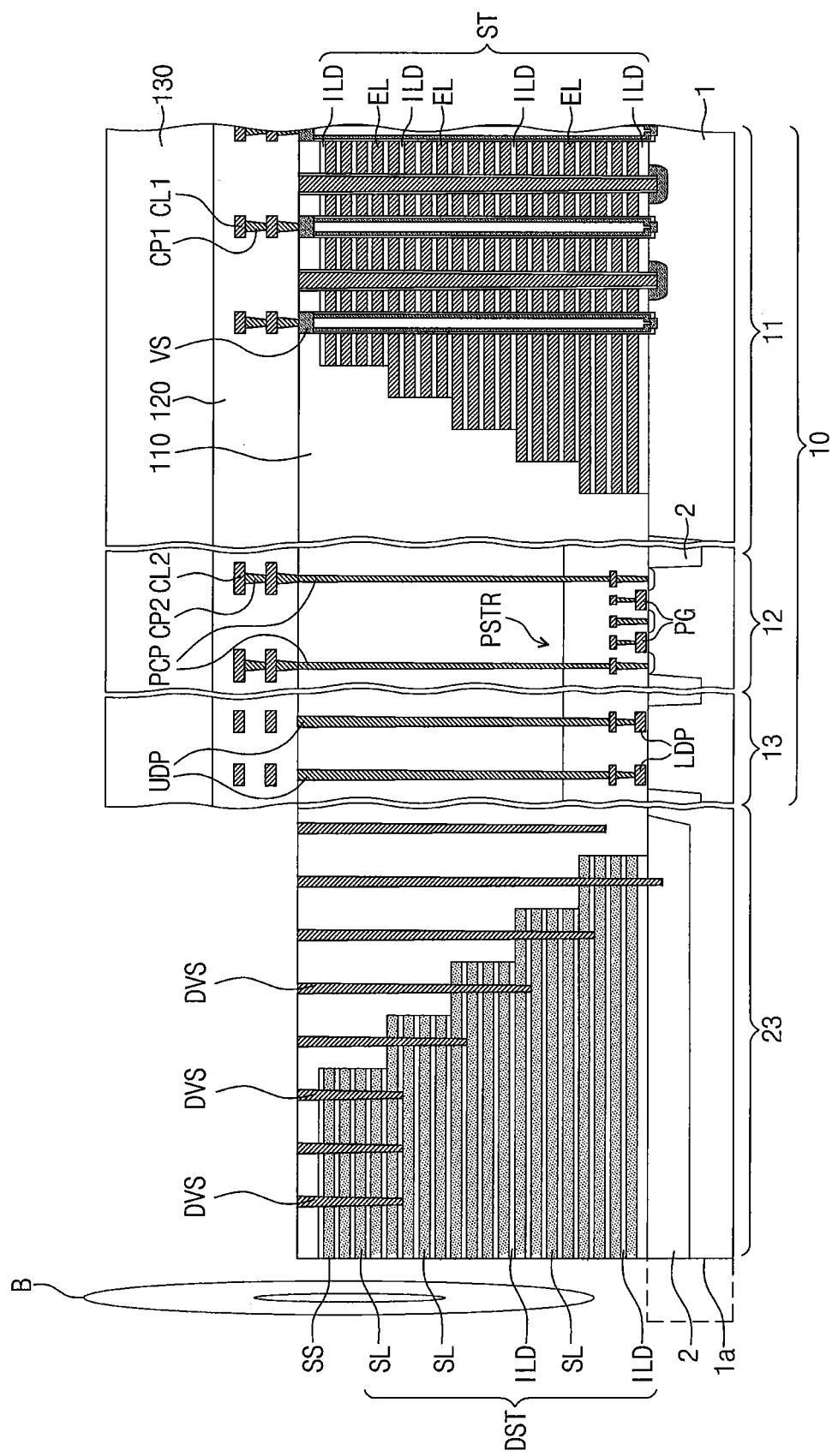

According to some embodiments, as illustrated in FIG. 12, one or more of the dummy vertical structures DVS may penetrate the dummy stack structure DST so as to be inserted in the substrate 1 or the device isolation layer 2. In other words, a bottom surface of the one or more of the dummy vertical structures DVS may be disposed at a lower level than the top surface of the substrate 1.

Figure 13:
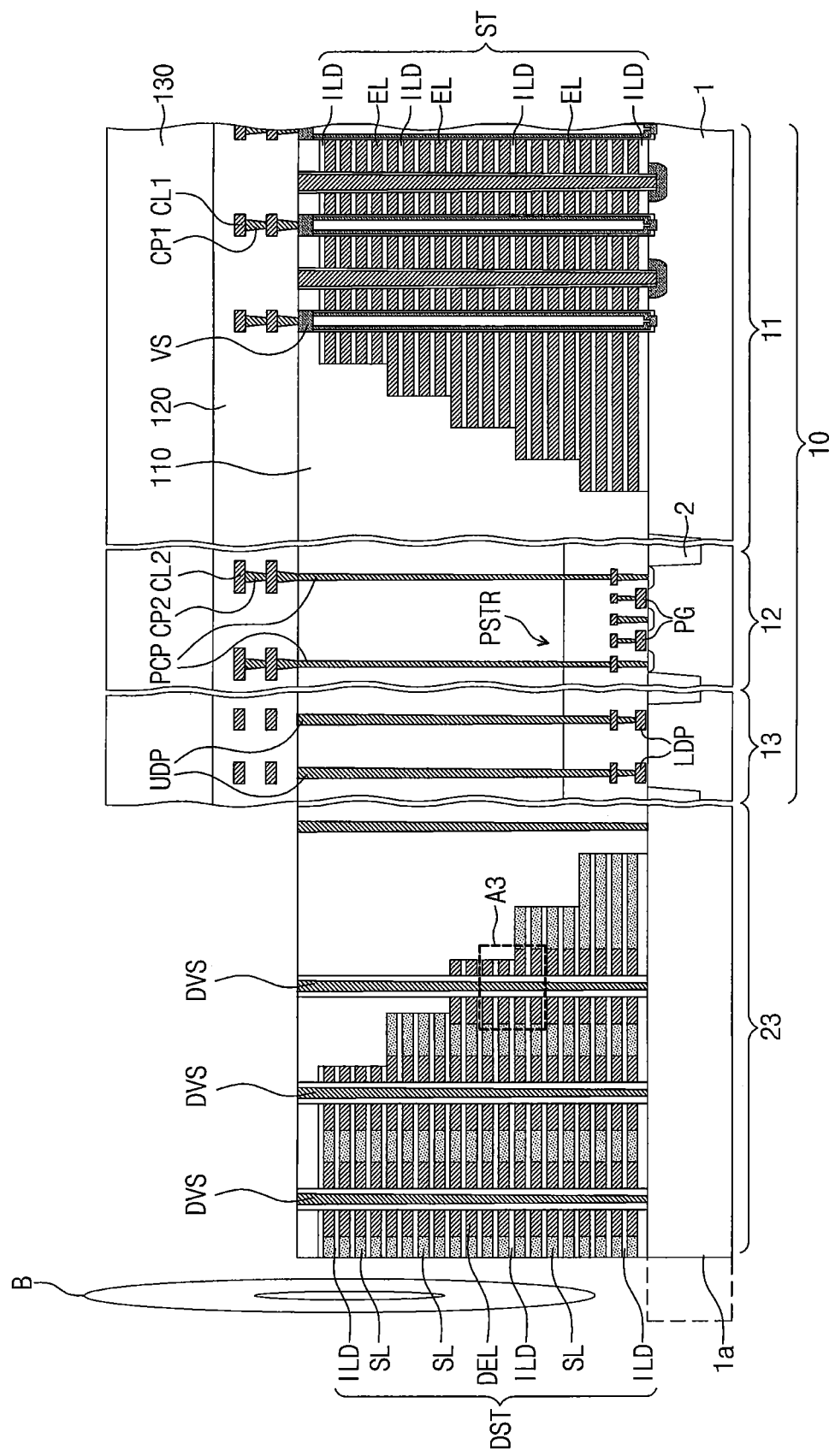
Figure 14:
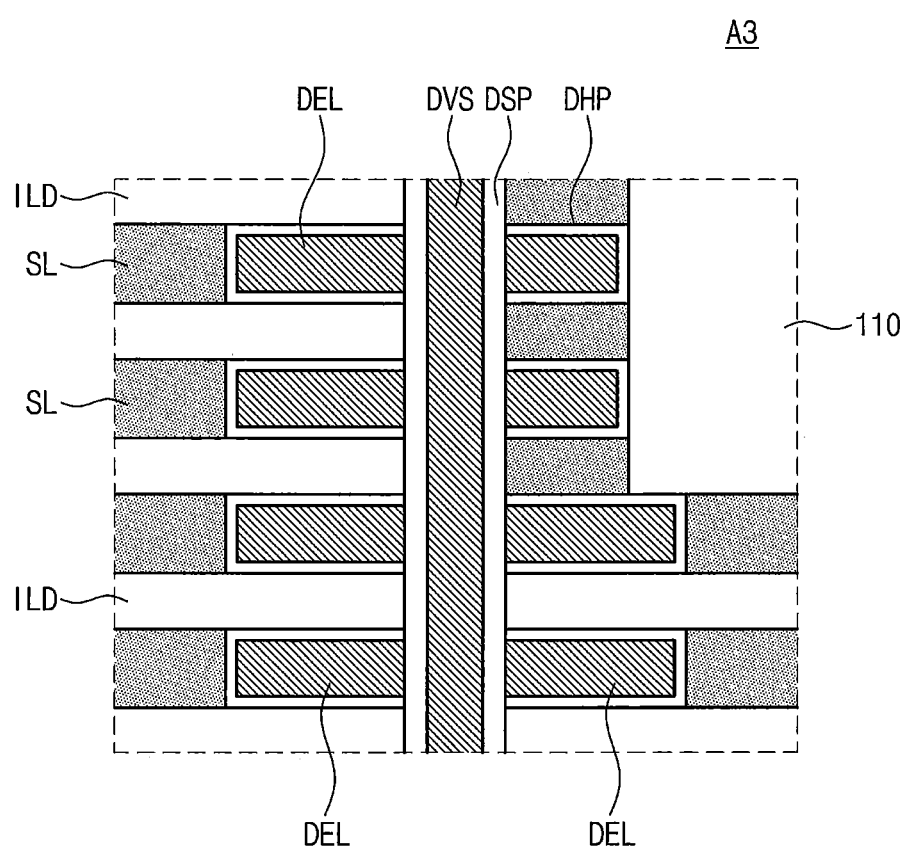
FIG. 14 is an enlarged view of a portion 'A3' of FIG. 13.

Referring to FIGS. 13 and 14, a dummy stack structure DST may include insulating layers ILD and sacrificial layers SL which are alternately stacked on the substrate 1. In addition, the dummy stack structure DST may further include dummy electrodes DEL, disposed at sides of ones of the sacrificial layers SL between the insulating layers ILD vertically adjacent to each other. In other words, the dummy electrodes DEL may be laterally adjacent to ones of the sacrificial layers SL between the insulating layers ILD vertically adjacent to each other. The dummy electrodes DEL may include the same material as the electrodes EL included in the stack structure ST of the cell array region 11. In addition, a dummy horizontal insulating layer DHP may be disposed between ones of the dummy electrodes DEL and ones of the sacrificial layers SL which are laterally adjacent to each other. The dummy horizontal insulating layer DHP may extend onto a top surface and a bottom surface of ones of the dummy electrodes DEL.

In such embodiments, the dummy vertical structures DVS may penetrate the dummy electrodes DEL, and a dummy spacer DSP may be disposed between ones of the dummy vertical structures DVS and the dummy electrodes DEL. Here, the dummy vertical structures DVS may include the same material as the common source plug CSP of the cell array region 11.

According to some embodiments, as illustrated in FIGS. 15 to 17, the dummy stack structure DST may include the insulating layers ILD and the sacrificial layers SL alternately stacked, and the number of the sacrificial layers SL included in the dummy stack structure DST may be smaller than the number of the electrodes EL included in the stack structure ST. In other words, a thickness of the dummy stack structure DST in a vertical direction that is perpendicular to the top surface of the substrate 1 may be smaller than a thickness of the stack structure ST in the vertical direction.

Referring to FIG. 15, a top surface of the dummy stack structure DST may be lower than a top surface of the stack structure ST. Thus, lower portions of the dummy vertical structures DVS may penetrate the dummy stack structure DST.

Referring to FIG. 16, a lower insulating layer 50 may be disposed on the edge region 23 of the scribe line region 20 of the substrate 1, and the dummy stack structure DST may include the insulating layers ILD and the sacrificial layers SL which are alternately stacked on the lower insulating layer 50. In other words, a bottom surface of the dummy stack structure DST may be spaced apart from the top surface of the substrate 1. In addition, a top surface of the dummy stack structure DST may be lower than the top surface of the stack structure ST. Thus, intermediate portions of the dummy vertical structures DVS may penetrate the dummy stack structure DST, and lower portions of the dummy vertical structures DVS may penetrate the lower insulating layer 50.

Referring to FIG. 17, the dummy stack structure DST may include the insulating layers ILD and the sacrificial layers SL alternately stacked on the lower insulating layer 50, and a top surface of the dummy stack structure DST may be disposed at the same height as the top surface of the stack structure ST. Here, upper portions of the dummy vertical structures DVS may penetrate the dummy stack structure DST, and lower portions of the dummy vertical structures DVS may penetrate the lower insulating layer 50.

According to some embodiments of the inventive concepts, the dummy stack structure DST and the dummy vertical structures DVS penetrating the dummy stack structure DST may be disposed on the edge region 23 of the scribe line region 20 of the substrate 1, and thus it may possible to prevent a crack generated during the sawing process of the substrate 1 from propagating to the cell array structure disposed on the chip region 10 of the substrate 1.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A three-dimensional (3D) semiconductor device comprising:
    a substrate including a chip region and a scribe line region;
    a cell array structure including memory cells three-dimensionally arranged on the chip region of the substrate;
    a stack structure disposed on the scribe line region of the substrate, the stack structure including first layers and second layers that are vertically and alternately stacked;
    a plurality of vertical structures extending along a vertical direction that is perpendicular to a top surface of the substrate, the plurality of vertical structures penetrating the stack structure; and
    a peripheral logic structure disposed between the cell array structure and the stack structure, the peripheral logic structure including peripheral logic circuits on the chip region of the substrate, and
    a dam pattern extending along an edge of the chip region and disposed between the stack structure and the cell array structure, the dam pattern surrounding the cell array structure,
    wherein the dam pattern is spaced apart from the stack structure and the cell array structure,
    wherein the stack structure has a staircase portion adjacent to the dam pattern and a vertically aligned sidewall opposite to the staircase portion,
    wherein the plurality of vertical structures including a first vertical structure penetrating the staircase portion and a second vertical structure penetrating the stack structure between the staircase portion and the vertically aligned sidewall, and
    wherein a vertical length of the first vertical structure is different from a vertical length of the second vertical structure.

2. The 3D semiconductor device of claim 1, wherein the first layers are formed of a different insulating material from the second layers.

3. The 3D semiconductor device of claim 1, wherein the first layers comprise a conductive material and the second layers comprise an insulating material.

4. The 3D semiconductor device of claim 1, wherein a number of the electrode layers stacked in the cell stack structure is equal to a number of the first layers stacked in the stack structure of the scribe line region.

5. The 3D semiconductor device of claim 1, wherein the stack structure includes pad portions of which vertical distances from the top surface of the substrate, in the vertical direction, sequentially decrease as a horizontal distance from the chip region, in a direction that is parallel to the top surface of the substrate, decreases,
    wherein the cell stack structure includes pad portions of which vertical distances from the top surface of the substrate, in the vertical direction, sequentially decrease as a horizontal distance from the scribe line region, in the direction that is parallel to the top surface of the substrate, decreases, and
    wherein the pad portions of the stack structure face the pad portions of the cell stack structure on the substrate.

6. The 3D semiconductor device of claim 1, wherein a vertical length of the first vertical structure is greater than a vertical length of the second vertical structure.

7. The 3D semiconductor device of claim 1, wherein the plurality of vertical structures including a third vertical structure penetrating the staircase portion,
    wherein the third vertical structure disposed between the first vertical structure and the second vertical structure, and
    wherein a vertical length of the third vertical structure has a value between the vertical length of the first vertical structure and the vertical length of the second vertical structure.

8. A three-dimensional (3D) semiconductor device comprising:
    a substrate including a top surface comprising a chip region and a scribe line region;
    a cell array structure including a plurality of memory cells three-dimensionally arranged on the chip region of the substrate;
    a dam pattern extending along an edge of the chip region and surrounding the cell array structure, the dam pattern extending in a vertical direction that is substantially perpendicular to the top surface of the substrate;
    a stack structure disposed on the scribe line region of the substrate and being spaced apart from the dam pattern, the stack structure including first layers and second layers that are vertically and alternately stacked;
    a plurality of vertical structures extending along a vertical direction that is perpendicular to a top surface of the substrate, the plurality of vertical structures penetrating the stack structure; and
    a peripheral logic structure disposed between the cell array structure and the stack structure, the peripheral logic structure including peripheral logic circuits on the chip region of the substrate,
    wherein the stack structure includes pad portions of which vertical distances from the top surface of the substrate, in the vertical direction, sequentially decrease as a horizontal distance from the chip region, in a direction that is parallel to the top surface of the substrate, decreases, wherein each of the first layers includes an insulating pattern and a conductive pattern, and wherein a side surface of the insulating pattern and a side surface of the conductive pattern contact each other.

9. The 3D semiconductor device of claim 8, wherein the first layers are formed of a different material from the second layers.

10. The 3D semiconductor device of claim 8, wherein the cell array structure comprises:
  a cell stack structure including insulating layers and electrode layers that are vertically alternately stacked on the chip region of the substrate;
  a plurality of cell vertical structures penetrating the cell stack structure; and
  a data storage layer disposed between each of the cell vertical structures and electrodes of the electrode layers.

11. The 3D semiconductor device of claim 10, wherein a number of the electrode layers of the cell stack structure is equal to a number of the first layers of the stack structure.

12. The 3D semiconductor device of claim 8, wherein the conductive pattern is disposed between the insulating pattern and one of the plurality of vertical structures.

13. The 3D semiconductor device of claim 8, the plurality of vertical structures including a first vertical structure and a second vertical structure having a different vertical length than the first vertical structure.

14. A semiconductor device comprising:
  a substrate comprising a top surface comprising a cell array region, a dam region and a scribe line region, the dam region being disposed between the cell array region and the scribe line region;
  a stack structure on the cell array region of the top surface of the substrate, the stack structure comprising a plurality of insulating layers and a plurality of electrode layers that are disposed between adjacent ones of the insulating layers;
  a dummy stack structure on the scribe line region of the top surface of the substrate, the dummy stack structure comprising a plurality of dummy insulating layers that are aligned with ones of the plurality of insulating layers of the stack structure and a plurality of sacrificial layers that are disposed between adjacent ones of the dummy insulating layers and aligned with the electrode layers of the stack structure, the dummy stack structure comprising a sidewall surface extending in a vertical direction that is substantially perpendicular to the top surface of the substrate;
  a plurality of dummy vertical structures on the scribe line region of the top surface of the substrate, the plurality of dummy vertical structures extending in the vertical direction that is substantially perpendicular to the top surface of the substrate and spaced apart from each other in a first direction that is parallel to the top surface of the substrate, and
  a dam pattern on the dam region of the top surface of the substrate, the dam pattern extending in the vertical direction that is substantially perpendicular to the top surface of the substrate,
  wherein the dam pattern is spaced apart from the stack structure and the dummy stack structure, and
  wherein the plurality of sacrificial layers are formed of a different material from the plurality of electrode layers.

15. The semiconductor device of claim 14,
  wherein the dummy stack structure comprises a plurality of pad portions, the pad portions each comprising a respective plurality of the dummy insulating layers and sacrificial layers, ones of the pad portions comprising a top surface that is parallel to the top surface of the substrate and comprising sidewall surfaces that are perpendicular to the top surface of the substrate, that are facing the stack structure of the cell array region, and that are farther from the stack structure than the sidewall surfaces of others of the pad portions that are closer to the substrate, and
  wherein the plurality of dummy vertical structures penetrate top surfaces of respective ones of the pad portions of the dummy stack structure.

16. The 3D semiconductor device of claim 14, wherein the plurality of insulating layers and the plurality of dummy insulating layers include the same material as each other.

17. The 3D semiconductor device of claim 14, wherein the dummy stack structure comprise a plurality of dummy electrode that are disposed between adjacent ones of the dummy insulating layers, and
  wherein side surfaces of the plurality of dummy electrode and a side surfaces of the plurality of sacrificial layers contact each other.

18. The 3D semiconductor device of claim 14,
  wherein the plurality of vertical structures include a first dummy vertical structure and a second dummy vertical structure penetrating at least one of the plurality of dummy insulating layers and at least one of the plurality of sacrificial layers;
  wherein the first dummy vertical structure is located between the second dummy vertical structure and the stack structure, and
  a vertical length of the first vertical structure is greater than a vertical length of the second vertical structure.

19. The 3D semiconductor device of claim 18, the stack structure has a staircase portion adjacent to the dam pattern,
  wherein the plurality of vertical structures include a third vertical structure penetrating the staircase portion,
  wherein the third vertical structure disposed between the first vertical structure and the second vertical structure, and
  wherein a vertical length of the third vertical structure has a value between the vertical length of the first vertical structure and the vertical length of the second vertical structure.

20. The 3D semiconductor device of claim 18, wherein the dummy stack structure further comprise a plurality of dummy electrode that are disposed between adjacent ones of the dummy insulating layers, and
  wherein the plurality of vertical structures is closer to the plurality of dummy electrode than the plurality of sacrificial layers.

* * * * *